(12) United States Patent
Sherry et al.

(10) Patent No.: US 10,686,269 B2
(45) Date of Patent: Jun. 16, 2020

(54) HIGH ISOLATION CONTACTOR WITH TEST PIN AND HOUSING FOR INTEGRATED CIRCUIT TESTING

(71) Applicant: Johnstech International Corporation, Minneapolis, MN (US)

(72) Inventors: Jeffrey Sherry, Savage, MN (US); Michael Andres, Inver Grove Heights, MN (US)

(73) Assignee: JOHNSTECH INTERNATIONAL CORPORATION, Minneapolis, MN (US)

( * ) Notice: Subject to any disclaimer, the term of this patent is extended or adjusted under 35 U.S.C. 154(b) by 79 days.

(21) Appl. No.: 16/140,853

(22) Filed: Sep. 25, 2018

(65) Prior Publication Data
US 2019/0097333 A1 Mar. 28, 2019

Related U.S. Application Data

(60) Provisional application No. 62/562,705, filed on Sep. 25, 2017.

(51) Int. Cl.
| | | |
|---|---|---|
| *H01R 12/70* | (2011.01) | |
| *G01R 31/28* | (2006.01) | |
| *H01R 12/82* | (2011.01) | |
| *G01R 1/04* | (2006.01) | |
| *H01R 13/24* | (2006.01) | |

(52) U.S. Cl.
CPC ....... *H01R 12/7076* (2013.01); *G01R 1/0466* (2013.01); *G01R 31/2886* (2013.01); *H01R 12/82* (2013.01); *H01R 13/2407* (2013.01); *H01R 13/2435* (2013.01); *H01R 2201/20* (2013.01)

(58) Field of Classification Search
CPC ............ H01R 12/7076; H01R 13/2407; H01R 13/2435; H01R 12/82; H01R 2201/20; G01R 31/2886; G01R 1/0466
See application file for complete search history.

(56) References Cited

U.S. PATENT DOCUMENTS

| | | | | |
|---|---|---|---|---|
| 4,607,907 A | * | 8/1986 | Bogursky | ............... H01R 12/82 439/682 |
| 4,846,704 A | * | 7/1989 | Ikeya | ................. G01R 31/2886 439/72 |
| 5,069,629 A | * | 12/1991 | Johnson | ............... G01R 1/0433 439/71 |
| 5,192,215 A | * | 3/1993 | Grabbe | ................ H01R 13/193 439/525 |

(Continued)

OTHER PUBLICATIONS

Written Opinion and International Search Report for PCT patent application No. PCT/US2018/052577 dated Jan. 16, 2019.

*Primary Examiner* — G. M. A Hyder
(74) *Attorney, Agent, or Firm* — Hamre, Schumann, Mueller & Larson, P.C.

(57) ABSTRACT

A test socket (14) for a testing an integrated circuit (12) with controlled impedance while maintaining the structural integrity of the test pins (20). The pin (20) can have a sidewall with a thick portion 32 and a thinner portion (30) along the length of the pin. The pin can have projections (42) which provide a standoff from the slot (40). The sidewalls themselves can have projections or lands (60, 61) which extend into the slot and provide stability for the pin (20).

23 Claims, 54 Drawing Sheets

(56) References Cited

U.S. PATENT DOCUMENTS

| | | | | |
|---|---|---|---|---|
| 5,199,883 | A * | 4/1993 | Uratsuji | H05K 7/1023 439/72 |
| 5,207,584 | A * | 5/1993 | Johnson | G01R 1/0433 439/66 |
| 5,511,984 | A * | 4/1996 | Olson | H01R 13/193 439/701 |
| 5,609,489 | A * | 3/1997 | Bickford | G01R 1/0433 439/72 |
| 5,967,848 | A | 10/1999 | Johnson et al. | |
| 6,174,744 | B1 * | 1/2001 | Watanabe | G01R 1/06744 438/14 |
| 6,203,329 | B1 | 3/2001 | Johnson et al. | |
| 6,529,025 | B1 * | 3/2003 | Kline | G01R 1/0466 324/754.18 |
| 6,749,443 | B2 * | 6/2004 | Sano | H01R 13/2485 439/331 |
| 7,639,026 | B2 | 12/2009 | Shell | |
| 7,666,016 | B2 * | 2/2010 | Kobayashi | H05K 7/1061 439/296 |
| 7,737,708 | B2 | 6/2010 | Sherry | |
| 8,952,714 | B2 | 2/2015 | Foong et al. | |
| 9,274,141 | B1 * | 3/2016 | Andres | G01R 1/06738 |
| 9,429,591 | B1 | 8/2016 | Johnson et al. | |
| 2002/0115337 | A1 * | 8/2002 | Yamada | G01R 1/0483 439/482 |
| 2003/0054675 | A1 * | 3/2003 | Ikeya | H05K 7/1069 439/71 |
| 2003/0054676 | A1 * | 3/2003 | Sano | G01R 1/0466 439/73 |
| 2007/0032128 | A1 * | 2/2007 | Lopez | G01R 1/0466 439/525 |
| 2008/0218177 | A1 | 9/2008 | Alladio et al. | |
| 2010/0231249 | A1 | 9/2010 | Dang et al. | |
| 2010/0264935 | A1 * | 10/2010 | Erdman | G01R 1/07378 324/537 |

\* cited by examiner

HIGH ISOLATION CONTACTOR WITH TEST PIN AND HOUSING FOR INTEGRATED CIRCUIT TESTING

BACKGROUND OF THE INVENTION

Field of Invention

This disclosure relates to the field of microcircuit/IC testing devices, more particularly, a test socket for testing integrated circuit chips.

Description of the Related Art

Microcircuits are well known electrical components that combine hundreds or thousands of individual circuit components and connections in a small volume. The package that holds a typical microcircuit may be no larger than 5 mm square by 0.5 mm thick. One common type of container for a microcircuit called a leadless package, has small connector or contact pads along the periphery of one surface of the package. A single package may have several dozen contact pads by which power is supplied to the microcircuits and signals sent to and from the microcircuit. The contact pads are soldered onto the conductors of a circuit board during assembly of the electrical device.

Before a microcircuit is soldered onto a circuit board, the microcircuit must be tested to assure design functionality. Soldering a defective microcircuit onto a circuit board often ruins the entire board, since typically it is either not possible or not economic to remove a defective microcircuit from a circuit board. Since typical microcircuits are the result of a complex manufacturing process, testing is essential to assure that every microcircuit is completely functional.

For a number of reasons, testing these microcircuits is complex. In the first place, one should not solder the microcircuits to be tested into the test fixture because the act of removing the microcircuits when testing is complete might itself damage the microcircuit.

Secondly, the microcircuits are small and the contacts are closely spaced, on perhaps as small as a 0.3 mm pitch or smaller. The contacts themselves may be as small as 0.05 mm wide for accurate testing; the test fixture contacts must make reliable, low-resistance contact with each of the microcircuit contacts during the entire test process, which may extend to even many hours. Failure to make proper contact with each microcircuit contact for the entire test sequence results in a test that incorrectly fails the microcircuit.

While it is important to test each microcircuit thoroughly, it is also important to test them quickly and cheaply. Accordingly, automated testers have been developed that operate with little human intervention to reliably test hundreds or thousands of individual microcircuits per hour.

A typical test contact has its own housing with one or more arrays of test contacts that are spaced and aligned to make temporary mechanical contact with the connector pads on the microcircuit package. Each test socket contact is designed to resiliently deflect a very small amount when force is applied. This accommodates any dimensional variations in either the microcircuit package or the test socket.

Some semiconductor devices operate at very high frequencies. In order to test them, higher performance contacts are needed. One method to improve the performance of a contact is to make it shorter and/or thinner.

When a contact pin gets thinner, it also changes its impedance which in turn changes the high frequency response. A thinner pin will also have less contact surface on the load board and thus resistance may increase. Thinner contacts also have the disadvantage of being more likely to bend in response to insertion by a robotic inserter/handler. A solution to these problems is needed.

Reference to U.S. Pat. Nos. 7,737,708, 5,967,848, 6,203,329 and 9,274,141 which are incorporated herein by reference as background material.

BRIEF SUMMARY

The following summary is intended to assist the reader in understanding some aspects of the disclosure. It does not define the scope of the invention. Please refer to the claims for that.

As IC chips have higher densities, it is necessary to make the test contactor/housing smaller to accommodate. Test contacts/pins are assembled into a housing/contactor to constrain them in place when testing an electronic device/IC. Specific changes to the geometry of the contacts and housing can be made to match the contact impedance to the Integrated Circuit (IC) impedance. This will reduce signal reflections while preventing a loss of mechanical performance.

This requires the pins and the spacing between the pins to be made likewise smaller. This creates several negative consequences including structurally weaker pins and problems with maintaining desired impedance of the test fixture due to the loss of dielectric space between pins. In electronics, impedance matching is the practice of designing the input impedance of an electrical load to maximize power transfer or minimize signal reflection from the load. Many integrated circuits are designed to have specific input and output impedances when soldered in place in an electronic device. To optimize test results, test equipment should also be constructed to minimize signal reflections and maximize power transfer.

One solution to the negative effects of a thinner pin is to make only part of the pin thinner and having another part wider. Another solution is to provide projections between the housing pin slot and the pin in order to stabilize it against bending or flexing laterally during testing. An important benefit of such solutions is that they provide additional dielectric benefits by providing spacing for air, which has a very high dielectric constant and allowed for better impedance and high frequency response. When this pin geometry is combined with a specific housing geometry, the result is air gaps between the pins. Air has a very low dielectric constant, so these air gaps improve the impedance of the pins when compared to the impedance of the same pins with typical housing materials between them.

The benefit of the invention allows thicker pins (hence stronger and able to carry more electrical current) that exhibit improved electrical performance through improved impedance.

Improved contact impedance can be achieved in many ways which are detailed below. Some examples are to provide an air gap between the pin and the housing holding the pin, but also providing a way to maintain the pin vertically oriented and providing strength to make up for the lack of solid wall interface of a typical housing which engages the pin sidewalls directly and provides support for the pin against lateral deflection and bending. The air gap can be created by making one or both sidewalls of the pin thicker than other parts of the pin. This will result in some of the pin engaging with the housing sidewall but still leaving increased air spacing along other parts of the pin. One solution is to place bumps (projections) on the sidewalls of the pin or the inner walls of the housing so that the projections provide the desired support but leave large air gaps. Note that since the pins are slidable in the slot, the pin is preferably only in slight frictional contact with the slot inner walls. That could also be considered an air gap but insignificant from an impedance point of view.

Another solution is to thicken part of the pin (or sidewall) but not all of it. One preferred place of thickening is at the base of the pin as it will reduce the pressure on the load board, which will minimize wear on the load board pad.

The two solutions can also be achieved simultaneously. For example, by creating a pin with a thicker portion on one or both sidewalls where the thicker portion traverses the pin adjacent the top to adjacent the bottom. If the pin is "s" shaped, then a serpentine s-shaped sidewall extension will create a stronger pin.

The same result can be achieved by providing projection(s) from the sidewall(s). The projections can be conductive and coated with a non-conductive layer so that the pins do not short to the inner housing walls, or non-conductive. A configuration like this with non-conductive projections can be used to position two pins next to each other (with no housing webbing/wall in between). The projections are preferably positioned differently on each side of the pin so that the projections don't touch each other and cause a problem when the contacts are installed against each other and then actuated during IC testing. In such case, the projections/lands of one pin sidewall are not aligned with the projections/lands of the adjacent pin sidewall so that the pins slide by each other but the projection of one pin does not touch or collide with the projections of the adjacent pin. The elimination of the housing separation wall between pins will allow tighter pin density and more dielectric air instead of housing dielectric. The configuration with non-conductive bumps can also be used with a metal housing for increased isolation between pins.

The projections can also be conductive with no coating.

Lowering the dielectric constant can be obtained by removing part of the housing sidewall where it is not needed for structural support. This increases the dielectric air volume between the contact pins.

It is possible to combine ceramics with metalizing. The pin or housing can be metalized over ceramic or other non-conductors, or reversed the metal layer can be within a sandwich of ceramic.

A preferred solution is that the base or lower portion of the pin is thicker than the upper portion. This provides a larger base for contact with the load board and also provides greater flexibility in getting a desired impedance match for the pin/housing. It also causes less damage to the load board because the force/unit area is lower. One solution is a stepwise change in the pin thickness and having a ledge where the changeover occurs. It could also be a smooth transition in thickness from one end to the other.

The disclosure provides full details of the inventive concepts, but the following is a summary to assist the reader.

There is disclosed, an apparatus for electrically connecting a lead of an integrated circuit (12) device to be tested to a corresponding terminal of a load board (24) at a test site, having any or all of the following elements:

a. a housing (14) having upper and lower surfaces, a first surface approachable by an integrated circuit device under test (12) to be tested and a second surface proximate the load board;

b. a slot extending through said housing from the first surface to the second surface, said slot including parallel spaced apart opposing first and second inner walls thereby defining a space between said sidewall;

c. a contact pin (20) having first and second sidewalls and being slideably receivable in said slot (40), said pin having a first end engageable by the lead and a second end in engagement with the terminal, said pin filling only a portion of said slot thereby leaving a gap between said pin sidewalls and said slot inner walls;

d. a first projection (61, 60, 47, 42, 43, 34) filling a portion of said gap adjacent said first inner wall and a second projection filling a portion of said gap adjacent said second inner wall; said projections providing longitudinal stability for said pin as it is engaged by the device under test and allowing air to provide a dielectric around said projections in said gap.

There is also disclosed an apparatus wherein said projections extend from said pin toward said inner wall.

There is also disclosed an apparatus wherein housing includes tubular elastomeric resilient element and wherein said pin includes an arcuate recess for receiving a portion of said resilient element and wherein said projection extends from said pin sidewalls and encompasses at least a portion of said resilient element.

There is also disclosed an apparatus wherein said projections are a plurality of lands spaced across the pin sidewall.

There is also disclosed an apparatus wherein said lands are asymmetrically placed on said first side wall relative to said second sidewall.

There is also disclosed an apparatus wherein said projections are a plurality of lands spaced across the pin inner wall of said slots.

There is also disclosed an apparatus wherein said projections extend from said inner walls of said slot toward said pin.

There is also disclosed an apparatus wherein said pin includes a top and bottom ends and wherein said projections extend adjacent said top and bottom ends.

There is also disclosed an apparatus wherein said pin includes a top and bottom ends and wherein said projections extend between said top and bottom ends along a curved path.

There is also disclosed an apparatus wherein said pin includes a top and bottom ends and wherein said projections extend between said top and bottom ends along a curved path and including a land portion partially surrounding said resilient member.

There is also disclosed an apparatus wherein said pin includes a top and bottom ends and wherein said projections extend between said top and bottom ends along a diagonal path.

There is also disclosed an apparatus wherein said housing (14) includes a top surface having said slots (40) and wherein said surface adjacent said slots is recessed (31) thereby exposing a portion of said pins to air.

There is also disclosed an apparatus for electrically connecting a lead of an integrated circuit (12) device to be tested to a corresponding terminal of a load board (24) at a test site, having any or all of the following elements:

a. a housing (14) having upper and lower surfaces, a first surface approachable by an integrated circuit device under test (12) to be tested and a second surface proximate the load board;

b. a slot extending through said housing from the first surface to the second surface, said slot including parallel spaced apart opposing first and second inner walls thereby defining a space between said sidewall;

c. a contact pin (20) having first and second sidewalls and being slideably receivable in said slot (40), said pin having a first end engageable by the lead and a second end in engagement with the terminal, said pin filling only a portion of said slot thereby leaving a gap between said pin sidewalls and said slot inner walls;

d. a first projection (61, 60, 47, 43, 42, 34) filling a portion of said gap extending from said first inner wall and a second projection filling a portion of said gap extending from said second inner wall; said projections providing longitudinal stability for said pin as it is engaged by the device under test and allowing air to provide a dielectric around said projections in said gap.

There is also disclosed an apparatus wherein said projections are lands having planar distal surfaces.

There is also disclosed an apparatus wherein said projections are conical having planar distal surfaces.

There is also disclosed an apparatus wherein said projections are spherical.

There is also disclosed an apparatus wherein said projections are cylindrical and having planar distal surfaces.

There is also disclosed an apparatus for electrically connecting a lead of an integrated circuit (12) device to be tested to a corresponding terminal of a load board (24) at a test site, having any or all of the following elements:

a. a housing (14) having upper and lower surfaces, a first surface approachable by an integrated circuit device under test (12) to be tested and a second surface proximate the load board;

b. a slot extending through said housing from the first surface to the second surface, said slot including parallel spaced apart opposing first and second inner walls thereby defining a space between said sidewall;

c. a contact pin (20) having first and second sidewalls and being slideably receivable in said slot (40), said pin having a first end engageable by the lead and a second end in engagement with the terminal, said pin filling only a portion of said slot thereby leaving a gap between said pin sidewalls and said slot inner walls;

d. a first projection (61, 60, 47, 43, 42, 34) filling a portion of said gap extending from said first and second pin sidewalls and filling a portion of said gap extending from said second inner wall; said projections providing longitudinal stability for said pin as it is engaged by the device under test and allowing air to provide a dielectric around said projections in said gap.

There is also disclosed an apparatus wherein housing includes tubular elastomeric resilient element and wherein said pin includes an arcuate recess for receiving a portion of said resilient element and wherein said projection extends from said pin sidewalls and encompasses at least a portion of said resilient element; and further including a stabilizer projection.

There is also disclosed a method of making a controlling the impedance of an integrated circuit test housing for testing a device under test, the housing having upper and lower surfaces, a first surface approachable by an integrated circuit device under test (12) to be tested and a second surface proximate the load board; a slot extending through said housing from the first surface to the second surface, said slot including parallel spaced apart opposing first and second inner walls thereby defining a space between said sidewall; a contact pin having first and second sidewalls and being slideably receivable in said slot, said pin having a first end engageable by the lead and a second end in engagement with the terminal, said pin filling only a portion of said slot thereby leaving a gap between said pin sidewalls and said slot inner walls; having any or all of the following steps:

forming a first projection filling a portion of said gap adjacent said first inner wall and a second projection filling a portion of said gap adjacent said second inner wall; allowing air to fill spaces around said projections to provide a dielectric around said projections in said gap.

There is also disclosed a method wherein said step of forming first and second projections includes forming a projection extending from each of said inner walls.

There is also disclosed a method wherein said step of forming first and second projections includes forming a projection extending from each sidewall of said pin.

DETAILED DESCRIPTION

Figure 1:
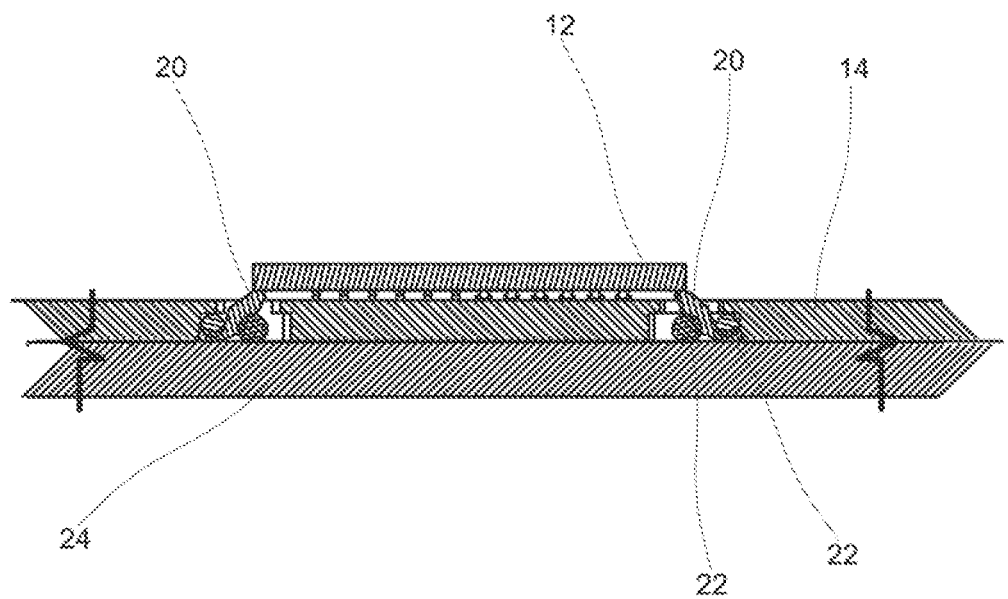
FIG. 1 is side plan sectional view of a device under test (DUT) in a housing with pins.

This disclosure is directed to a structure and method to make a better performing contact by making load board interface and maintaining or changing the housing, i.e. test contactor assembly, impedance to be suitable for the chip testing desired.

There are multiple ways to accomplish this shown in the drawings and described below.

One solution is making the pin contact wide enough to spread out stresses on the load board (i.e. bottom of pin) which reduces wear on the expensive load board. Simultaneously it allows the rest of contact to be thinner to improve impedance matching and mechanical robustness by having a thinner tipped contact hitting a small pad I/O on device.

Also, by making the upper portion of the contact thinner, there is a greater chance of solid electrical contact with a pad/ball of the device under test (DUT). The contact/pin preferably includes a thin portion running most of the length of contact makes the contact also lighter, thus reducing the forces needed to be applied during the insertion of DUT into the housing/contactor, thus improving the life of all parts of system.

Having the transition from small width top portion of contact to larger width bottom portion below the top of the front elastomer results in the best tradeoff between mechanical robustness and electrical performance. The transition from thinner top portion of contact can be a straight edge, which is easier to machine or chamfer to reduce reflections of the RF signals.

The housing slot changes widths based on contact width to make sure contact pin can hit the smallest of DUT pads. The location of the "step" (i.e. transition from thick to thin) in the housing can be optimized to align the contact pin accurately, but also to provide an improved effective dielectric constant between adjacent contact pins through the use of an air gap between the contact pin and the housing slot.

It is possible to add non-conductive bumps on the sidewalls of the pin/contacts allow a significant air gap all around the contacts. Having air between the contacts improves their impedance significantly when compared to most rigid structural materials that can be used to make a contactor/housing. The disadvantage of this is that it is difficult to manufacture non-conductive bumps on the sides of the contacts.

FIG. 1 is side plan sectional view of test system 10 with a housing/contactor 14 and device under test (DUT) 12 in a housing. Pins/contacts 20 with elastomer bias 22 elements and a load board 24. Bias elements 22 can be tubular, circular or spherical elastomers or other forms of spring bias. The pins include an arcuate region to receive a portion of the elastomer thereby biasing the pin.

Figure 2:
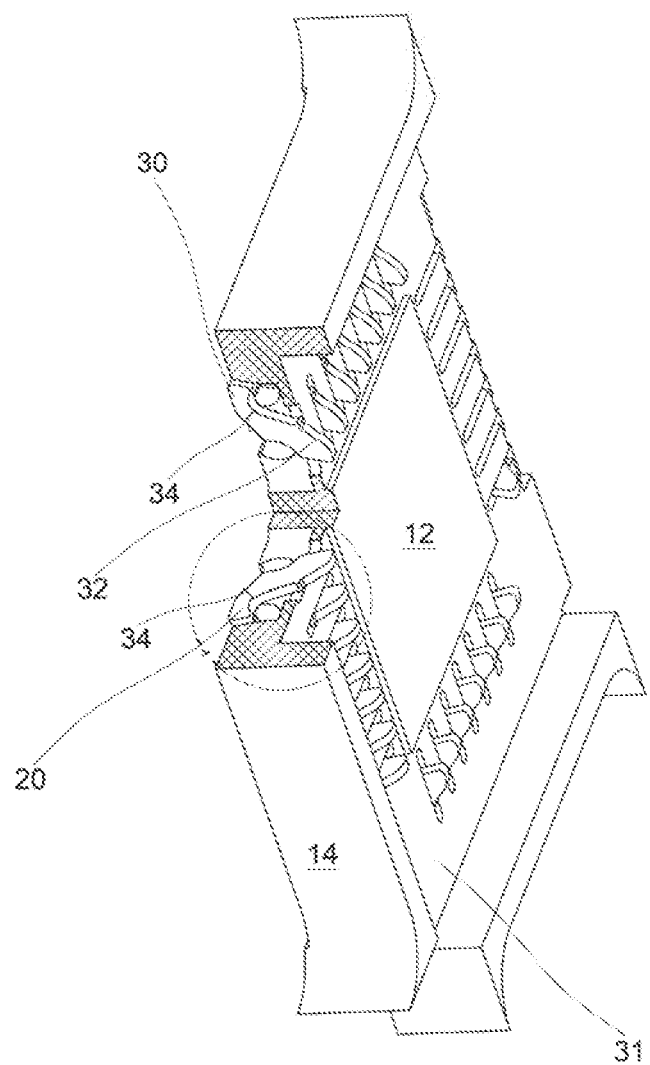
FIG. 2 is side perspective view of FIG. 1 with portions broken away and a close up of some pins.

FIG. 2 is a close up view with the elastomers removed. Pin 20 has a lower part 30 which engaged the load board and upper part 32 which engaged the DUT. The lower part 30 is thicker than the upper part 32 with a transitional step 34 therebetween. This step can also be a sloped taper. In this case 12 does not actually show a DUT. Rather, it is a platform in the center of the housing that is used to prevent the DUT from compressing/deflecting the pins too far. The DUT is not shown in this view from the top because it would cover the tops of the pins, hiding them from view. This platform in combination with the pocket/recess in the top of the housing around the contact pins creates an air gap between the contacts when they are compressed.

Figure 2A:
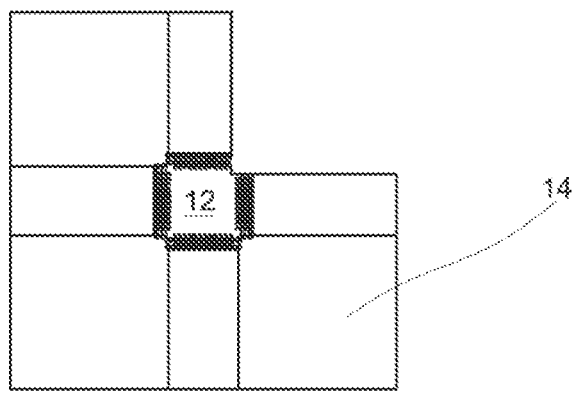
FIG. 2A is a top plan schematic view of a housing with portions broken away showing pin/contact configuration with a wider base together with a housing slot that is wide at the bottom and narrow at the top. The combination of housing and contact geometry produce air gaps between the contacts.

FIG. 2A is a top plan schematic view of a housing with portions broken away.

Figure 2B:
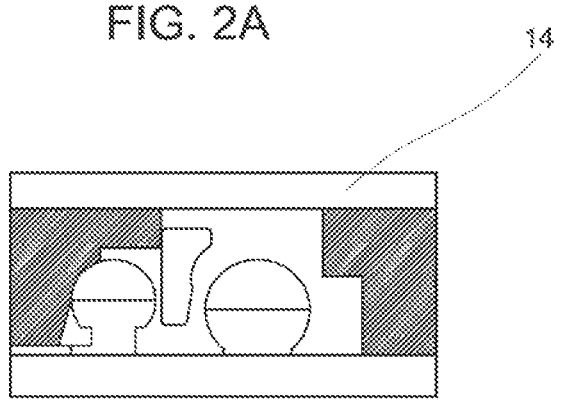
FIG. 2B is a side sectional view of a housing with pin removed. This view also shows a portion of the housing material between pins cut away to improve the dielectric constant of the material between the pins.

FIG. 2B is a side sectional view of a housing with pin removed. FIG. 2B shows a portion of the housing wall between pins cut away (i.e. creating a recess) to improve the dielectric constant of the material between the pins. With the cut out there is more air between the pins, so the effective dielectric is improved.

Figure 2C:
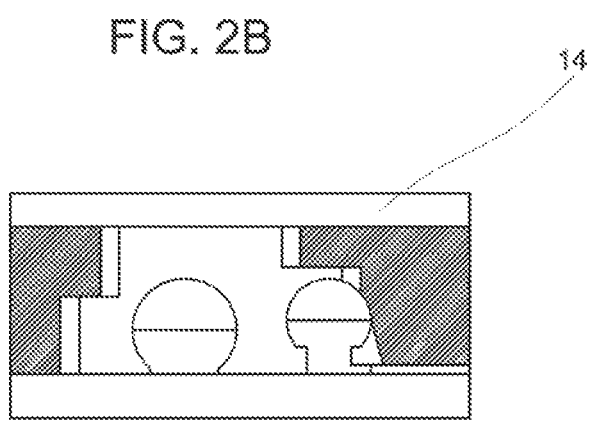
FIG. 2C is a side sectional view of a housing opposite of FIG. 2B of standard housing geometry.

FIG. 2C is a side sectional view of a housing opposite of FIG. 2B.

Figure 3:
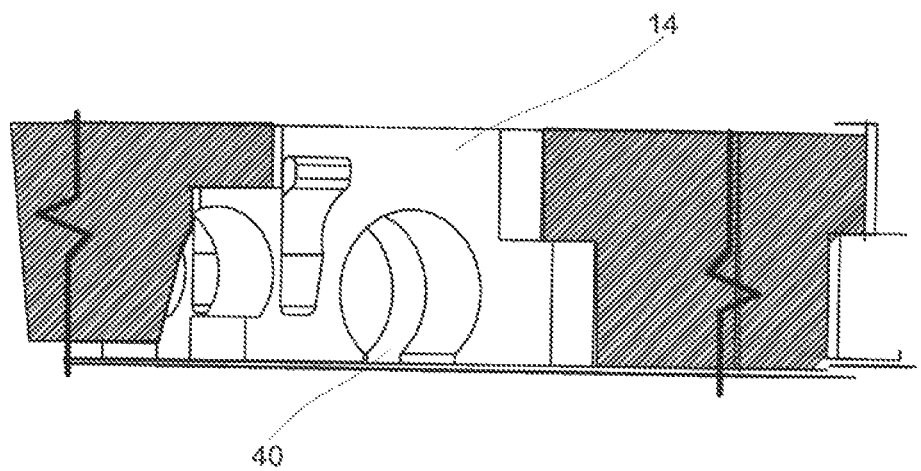
FIG. 3 is a perspective view of FIG. 2B.

FIG. 3 is a perspective view of FIG. 2B.

Figure 4:
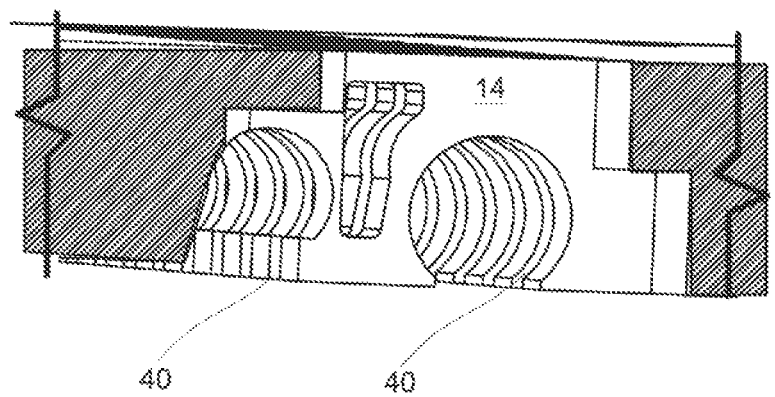
FIG. 4 is a view like FIG. 3 but with multiple pin slots shown in the housing.

FIG. 4 is a view like FIG. 3 but with multiple pin slots 40 shown in the housing.

Figure 5A:
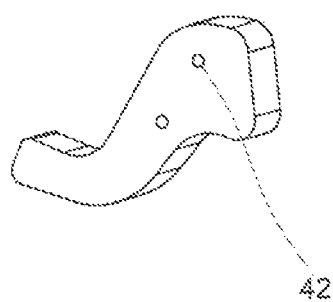
FIG. 5A is a side perspective view of a pin with projections. A configuration like this can be used to position two pins next to each other (with no housing webbing/wall in between). The projections are positioned differently on each side of the pin so that the projections don't touch each other and cause a problem when the contacts are installed against each other and then actuated during IC testing. The projections can be any shape that is convenient to manufacture. They do not have to be round.
Figure 5B:
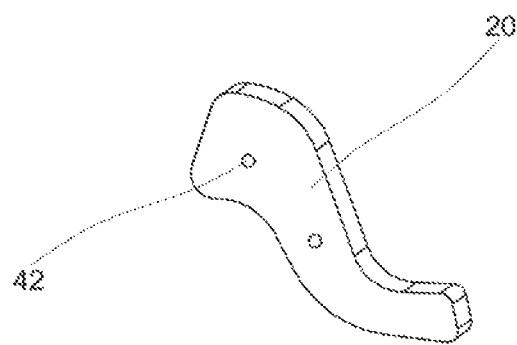
FIG. 5B is the other side of FIG. 5A.
Figure 5C:
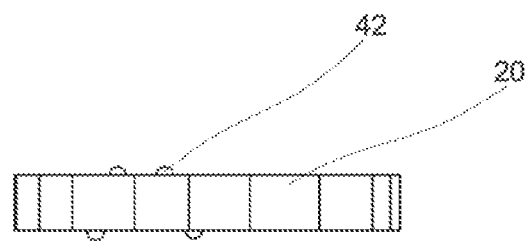
FIG. 5C is a top view of FIG. 5A but with closer projections on one side.
Figure 5D:
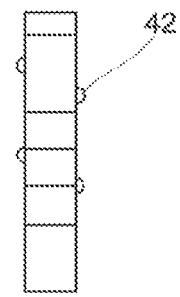
FIG. 5D is a bottom view of FIG. 5A.
Figure 5E:
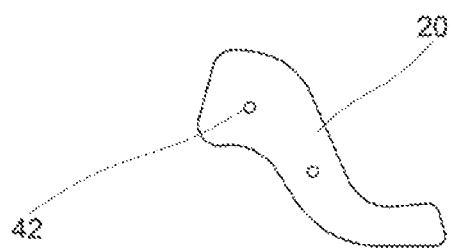
FIG. 5E is a side view of FIG. 5A.
Figure 5F:
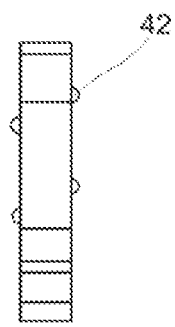
FIG. 5F is a top view of FIG. 5A
Figure 5G:
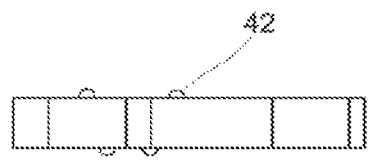
FIG. 5G is bottom view of FIG. 5A but with closer projections on one side like in FIG. 5C.

FIGS. 5A, 5B, 5C, 5D, 5E, 5F and 5G show one embodiment of pin 20 having projections or lands 42 on either or both sidewalls of the pins. The projections 42 are spaced apart along the sidewall. Notice that the projections can be symmetric on both sides (i.e. in the same location on both sides, or preferably asymmetrically). FIG. 5G is an asymmetrical example, where one side has the projections closer together and the other farther apart on the sidewall. It is useful to have the projections asymmetrically positioned in order that the pin be spaced from the housing slot sidewall on different points for stability and to resist torque forces which occur when a DUT engages the pin. This allows for pins to be used in very small pitch (spacing between pins) housing. A configuration like this (asymmetric projections) can be used to position two pins next to each other (with no housing webbing/wall in between). The projections are positioned differently on each side of the pin so that the projections don't touch each other and cause a problem when the contacts are installed against each other and then actuated during IC testing. This configuration allows the pins to be extremely close together, because there is no need for a thin housing web/wall in between pins.

The shape of the projections can be varied at their base and their entire profile. In this case, the projections are dome or hemispherical shaped.

Figure 6:
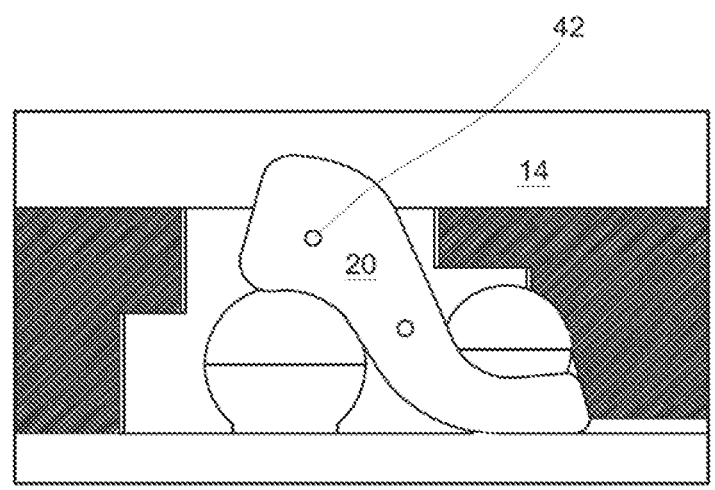
FIG. 6 is a side plan view of the pin in FIG. 5A in a housing.

FIG. 6 is a side plan view of the pin in FIG. 5A in a housing.

Figure 7:
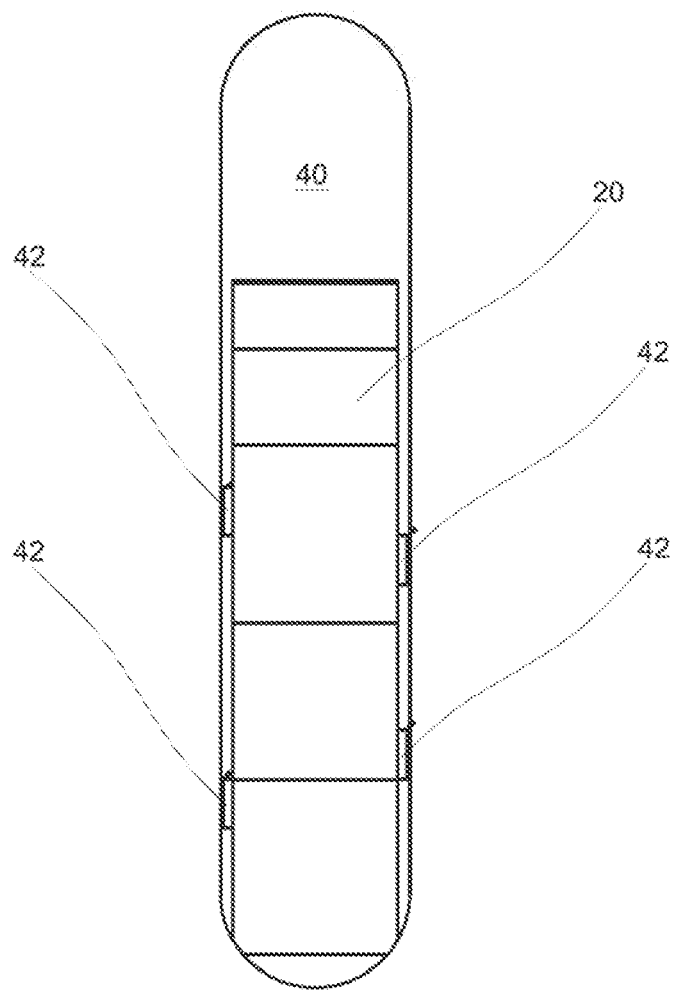
FIG. 7 is a top view of FIG. 6.
Figure 8:
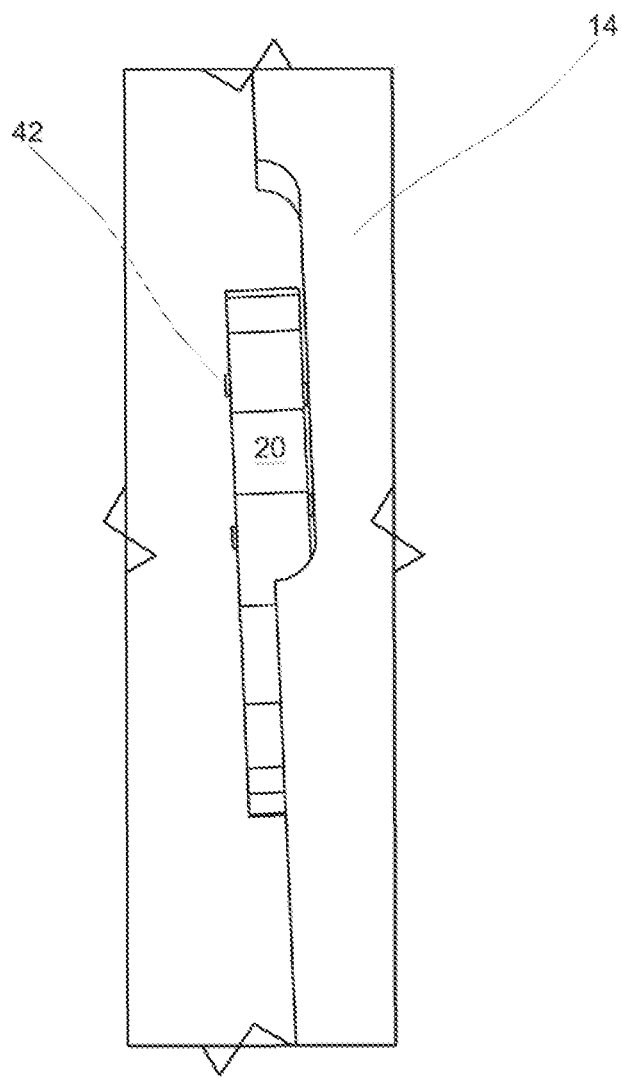
FIG. 8 is a top view of FIG. 6 with portions of the housing broken away.
Figure 9:
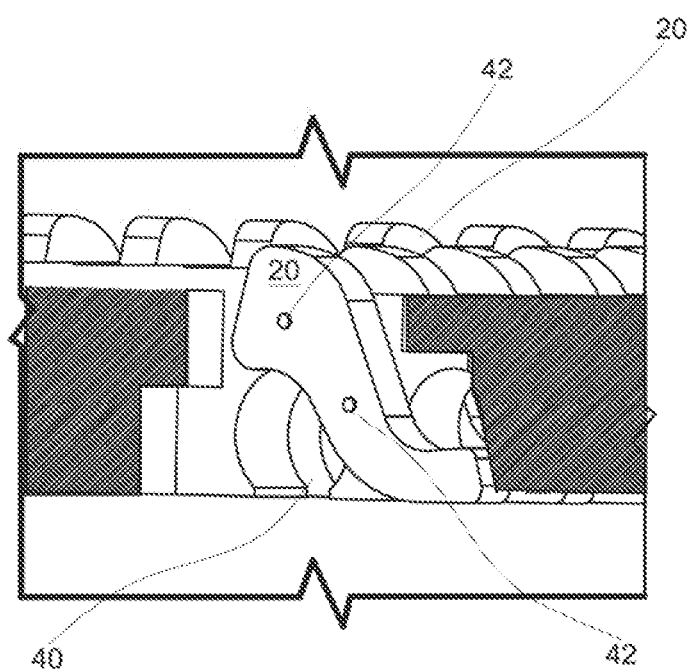
FIG. 9 is a perspective view of FIG. 6.

FIG. 7 is a top view of slot 40 showing the gap 48 which is filled by the pin 14 and projections 42. The gap is not completely transversely filled however, as the pin must be free to slide in the slot.

Figure 10:
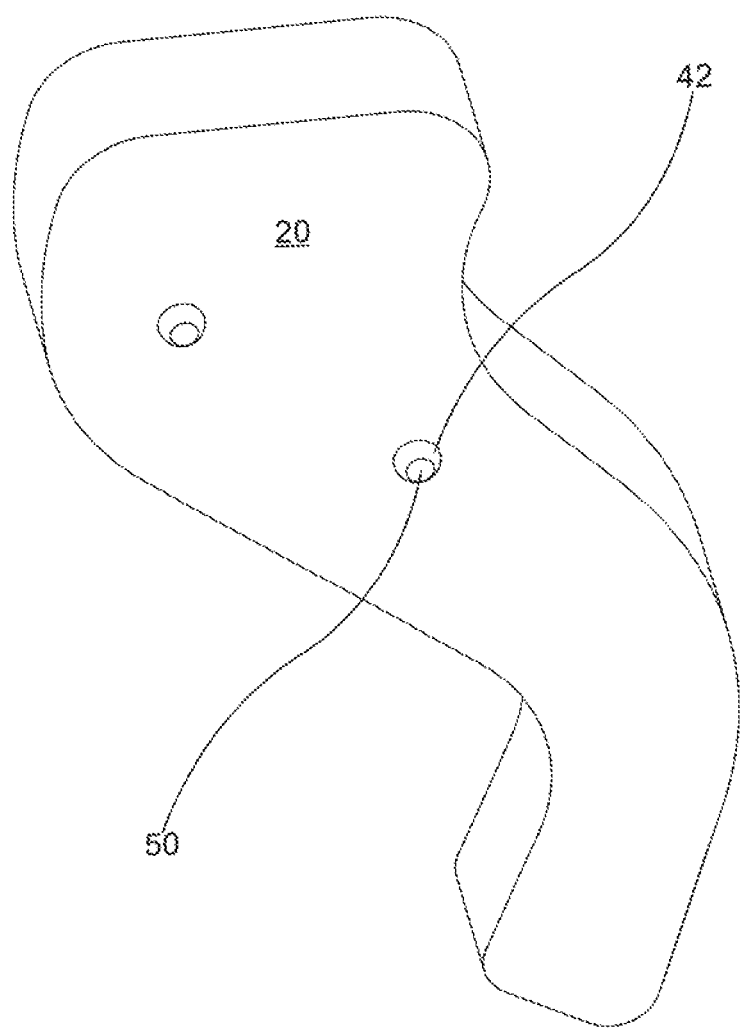
FIG. 10 is a perspective view of a pin like FIG. 5A except with truncated conical/domed projections.

FIG. 10 is a perspective view of a pin like FIG. 5A except with truncated conical/domed projections having a flat top surface 50 but a truncated conical base portion.

Figure 11:
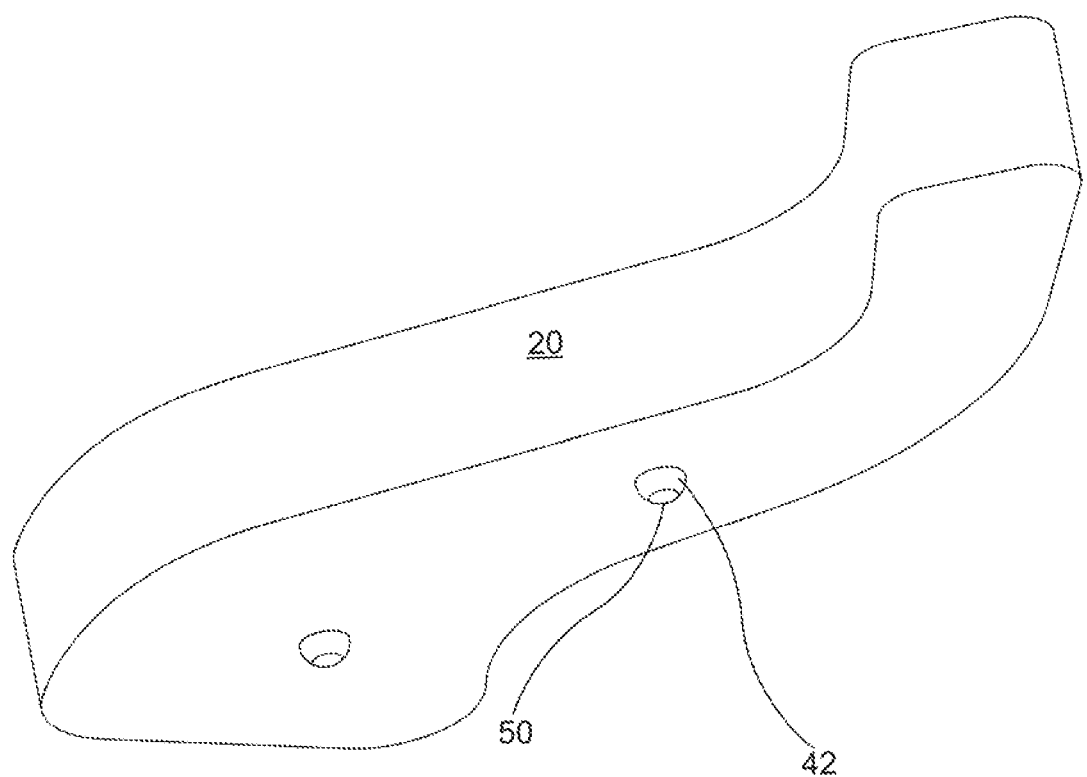
FIG. 11 is a rear perspective view of FIG. 10.
Figure 12:
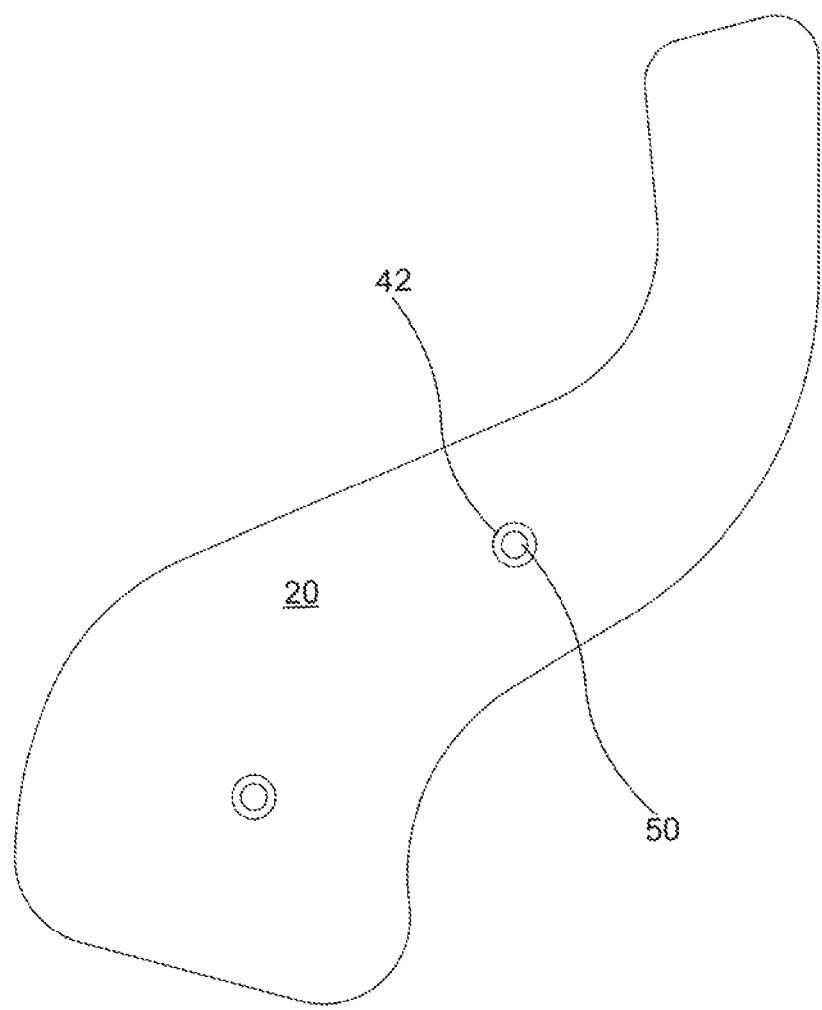
FIG. 12 is a side plan view of FIG. 10.
Figure 13:
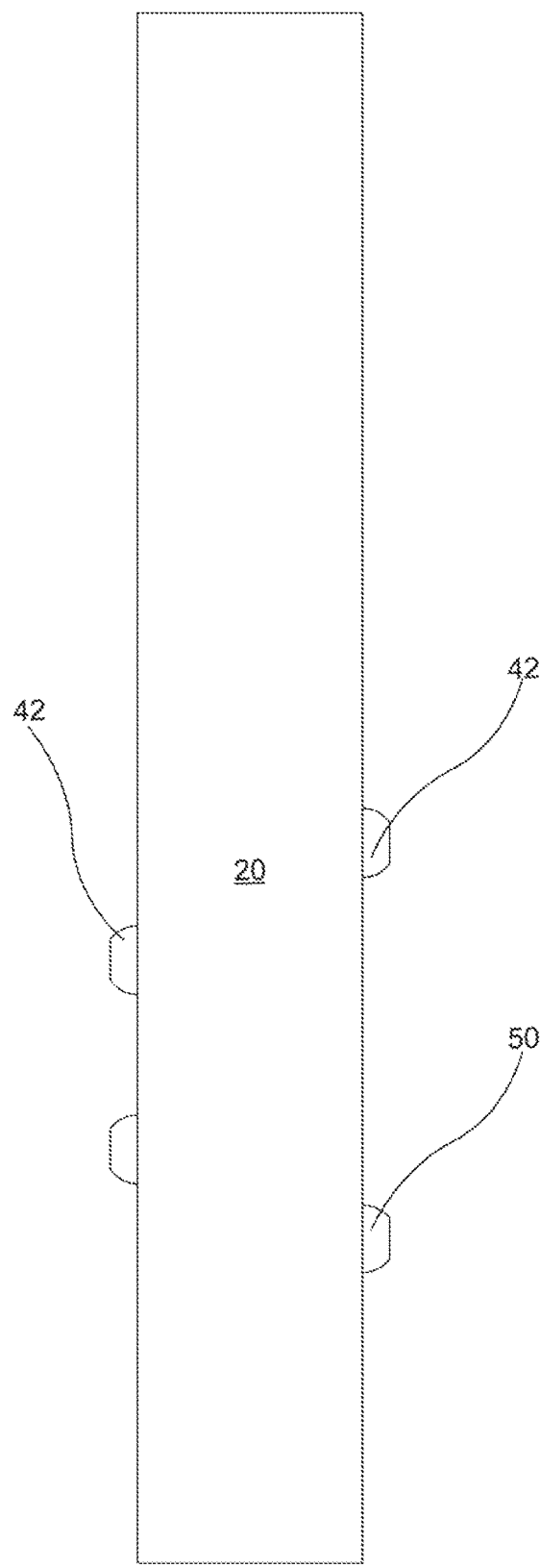
FIG. 13 is a bottom plan view of 12 showing projections on one side being closer to each other than projections on the other side, i.e. asymmetrical.
Figure 14:
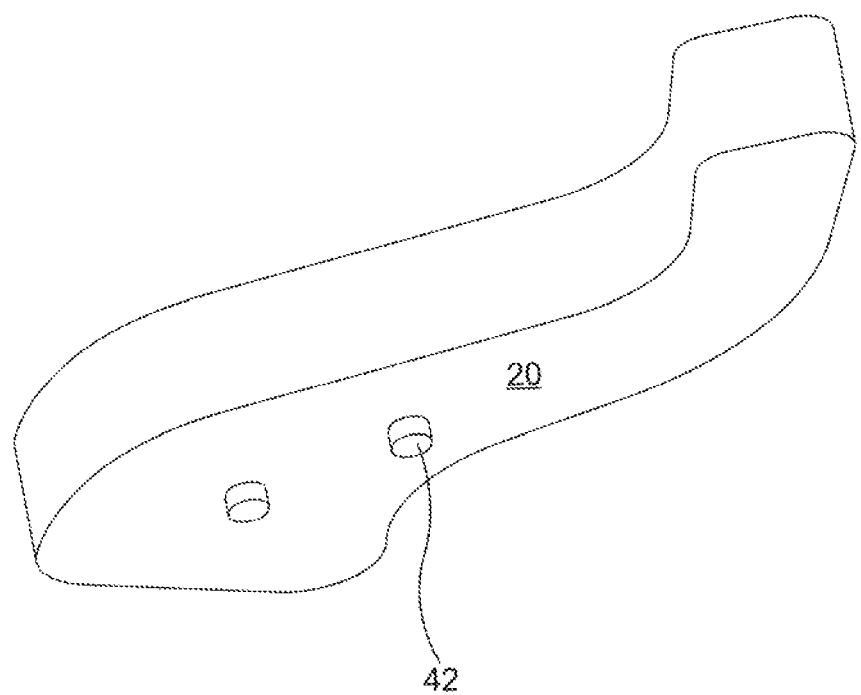
FIG. 14 is a view like FIG. 11 except with the projections being cylindrical.

FIG. 14 is a view like FIG. 11 except the pin 20 has projections which are cylindrical with a flat top.

Figure 15A:
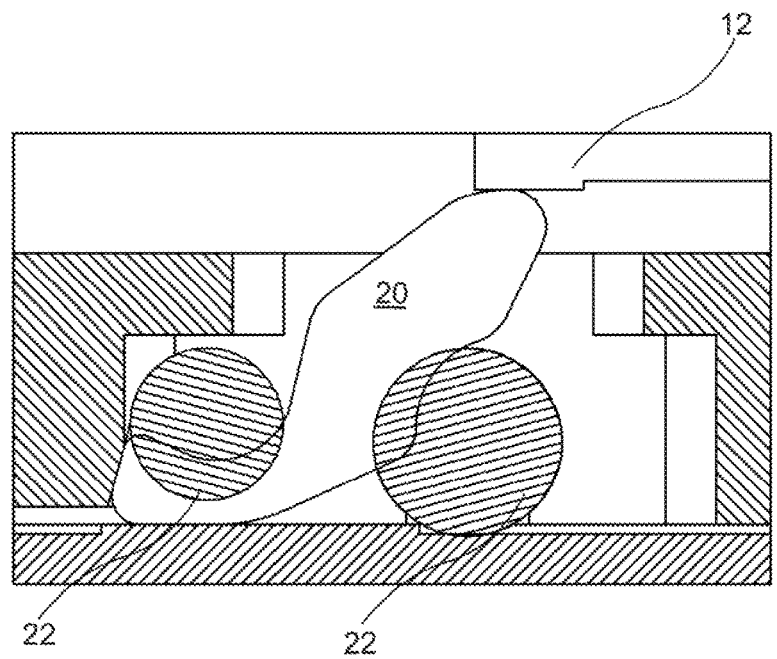
FIG. 15A is a side plan view of a section of the housing showing a pin with two elastomers.
Figure 15B:
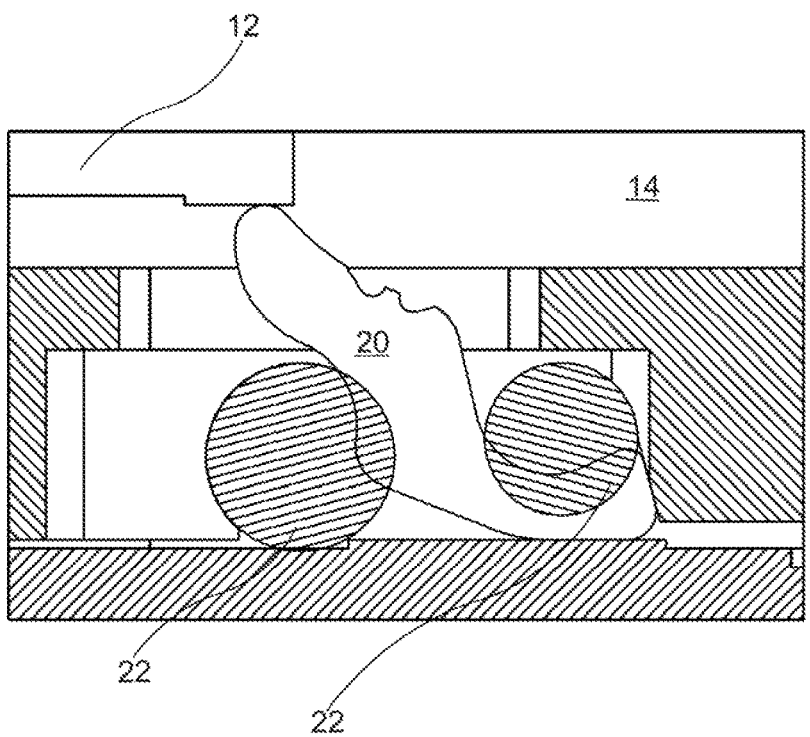
FIG. 15B is the other side view of FIG. 15A.

FIGS. 15A and 15B are side plan views of a section of the housing showing a pin 20 with a two elastomers 22 in a housing 14.

Figure 16:
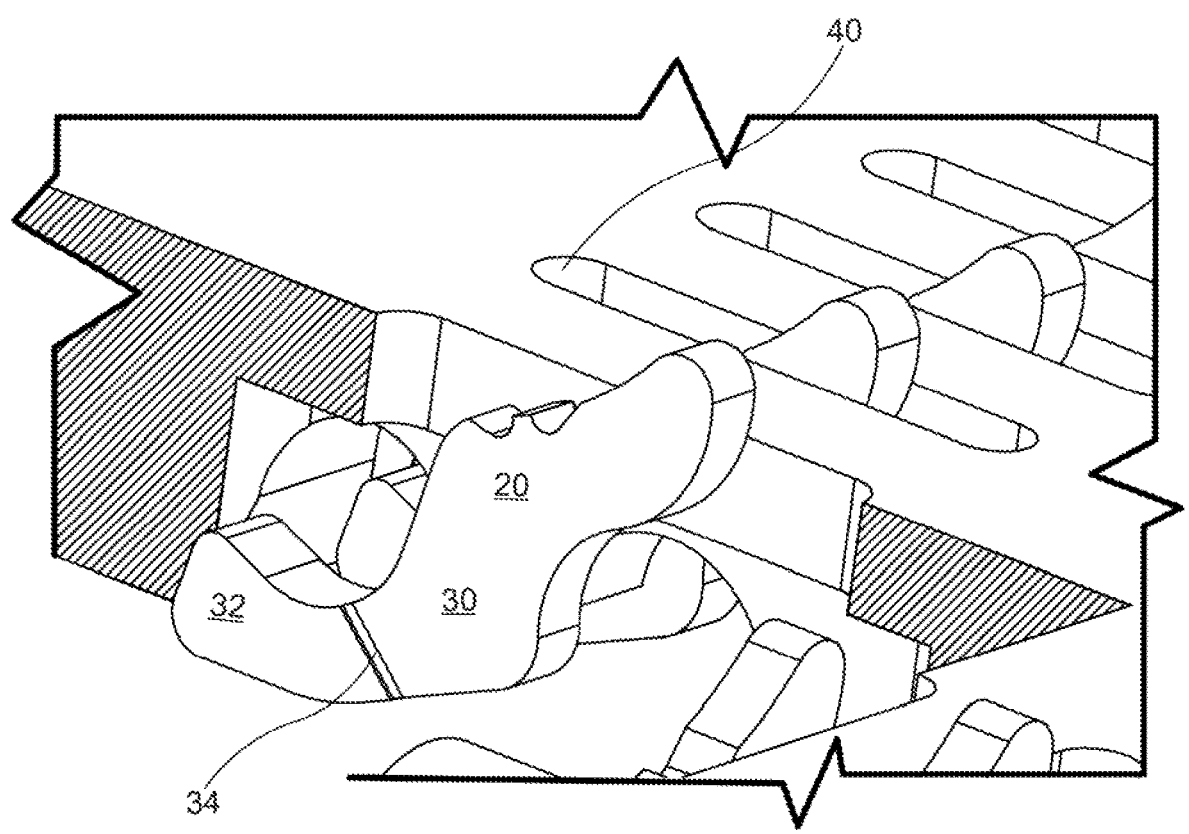
FIG. 16 is a perspective view with portions broken away of one embodiment of the pin with a wide foot/base.
Figure 17:
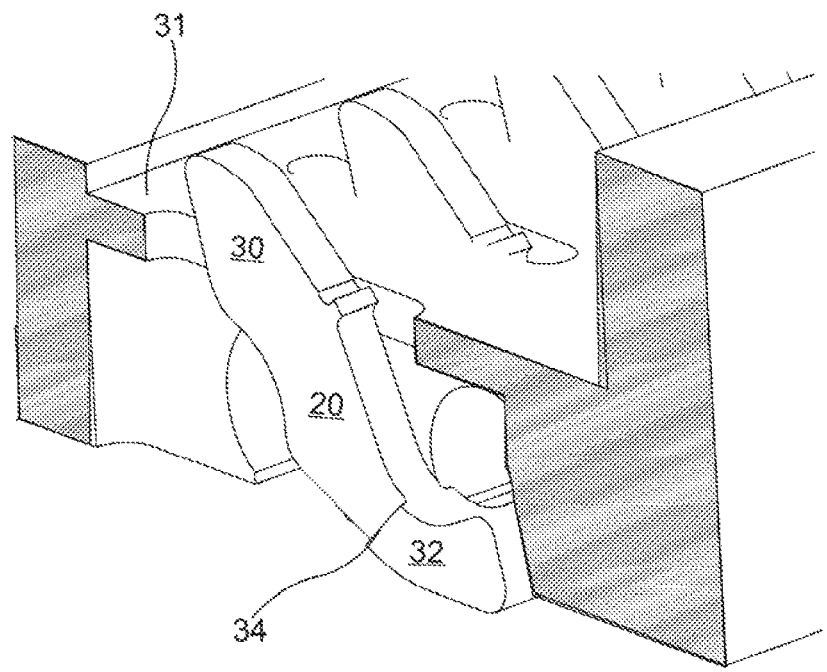
FIG. 17 is perspective view of the subject matter in FIG. 16.
Figure 17A:
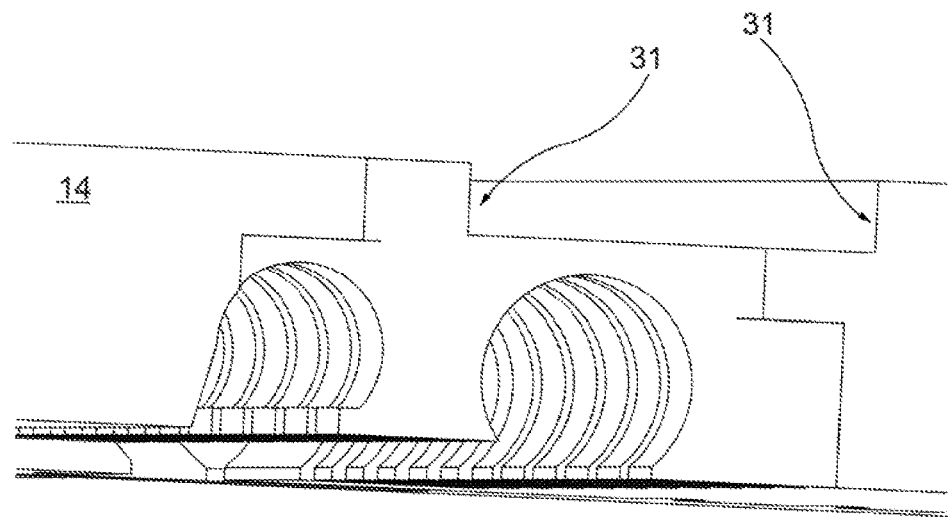
FIG. 17A is a side perspective view of the recess 31. Note that the housing in this figure does not touch the load board but is elevated or floating above it. This further increases the air dielectric.

FIGS. 16 and 17 are a perspective of pin 20 with upper pin portion 30, lower pin portion 32 and the step transition 34 shown in greater detail. The transition can be stepwise, sloped (arcuate) or other shape as desired. The position of the transition from thick (wide) to thin (narrow) can be varied. It is desirable that the thickened part of the pin be surrounding at least one-half or one-third or one quarter of the elastomer to minimize the shearing force of the pin the elastomer (as much as possible elastomer surface contact is preferred), but this competes with the benefit of the largest amount of thin pin area as possible to lower or reduce the dielectric effect. It is also desirable to have enough thick pin area to resist twisting/torqueing of the pin in response to its collision with the DUT. Furthermore, the thickened area at the base of lower pin part 32 spreads force over a larger area of the load board, which in turn reduces load board wear. The thickened portion 32 shown in FIGS. 16 and 17 is high enough up the pin to surround about one quarter to one third of the elastomer and about one quarter of the entire pin. Note that the thickened (wide) portion can be thickened only on one sidewall, or both as shown. FIGS. 17 and 17A also illustrate a feature to control impedance. The top of housing 14 has traditionally been flat, but as shown in FIGS. 2, 17, 17A and others, the top surface may include a recess 31 which exposes more of pin 20 toward their tip. Since air is the best dielectric, recessing the top surface adjacent the pins tips can improve performance. The remainder of the top surface is not recessed so that the DUT depth is properly aligned.

The contact pins are adjacent each other without intervening housing walls and their projections preferably are located on the sidewalls at positions so that projections are never in direct contact with each other even when the pins are deflected. Thus the preferred placement is asymmetrical.

Figure 18:
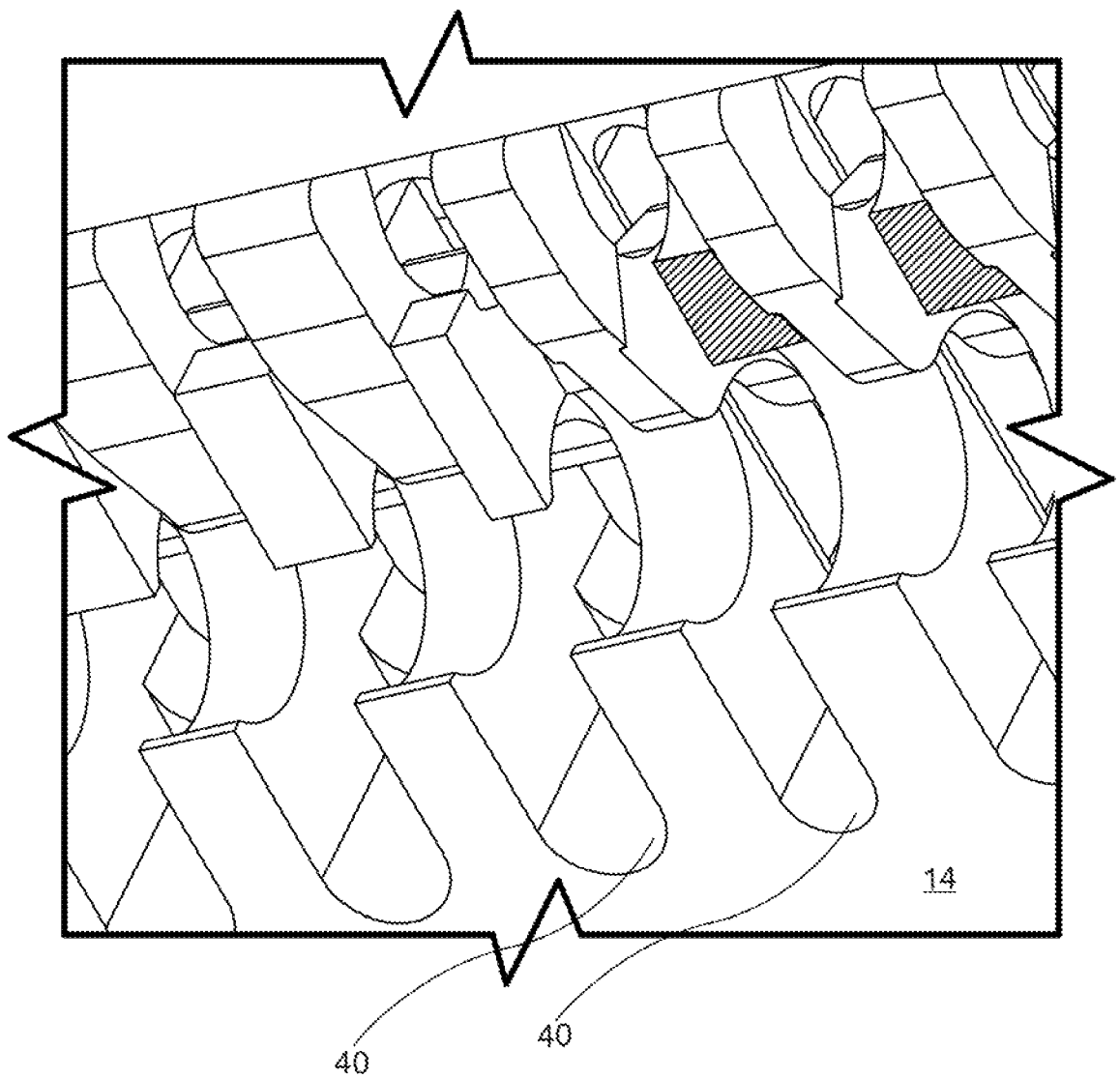
FIG. 18 is a bottom perspective view of the subject matter of FIG. 16. This view shows on the right side two areas of the housing cut away (cross hatch region) so that the narrow part of the contact can be seen.

FIG. 18 is a bottom perspective view of a housing showing slots 40 for pins. This view shows on the right side two areas of the housing cut away (cross hatch) so that the narrow part of the contact can be seen.

Figure 19:
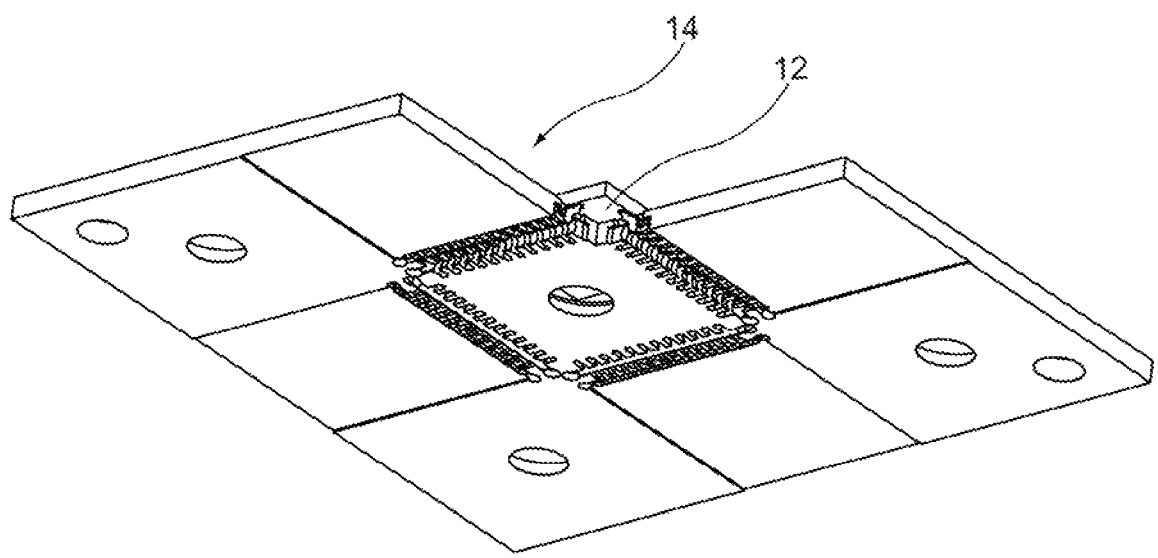
FIG. 19 is a bottom perspective view of a housing and DUT with portions broken away.
Figure 20:
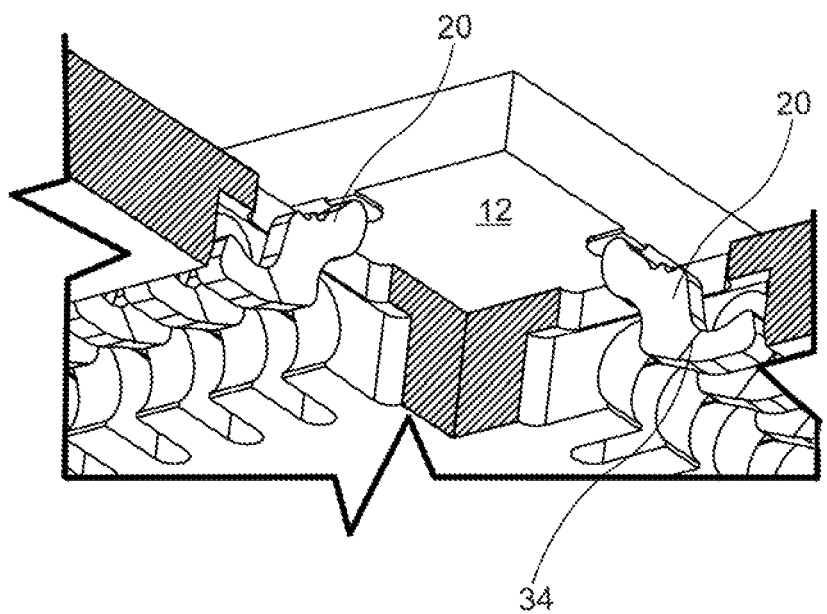
FIG. 20 is a close up perspective view of a portion of FIG. 19.

FIG. 19 is a bottom perspective view of a housing and DUT with portions broken away and FIG. 20 is a close up perspective view.

Figure 21:
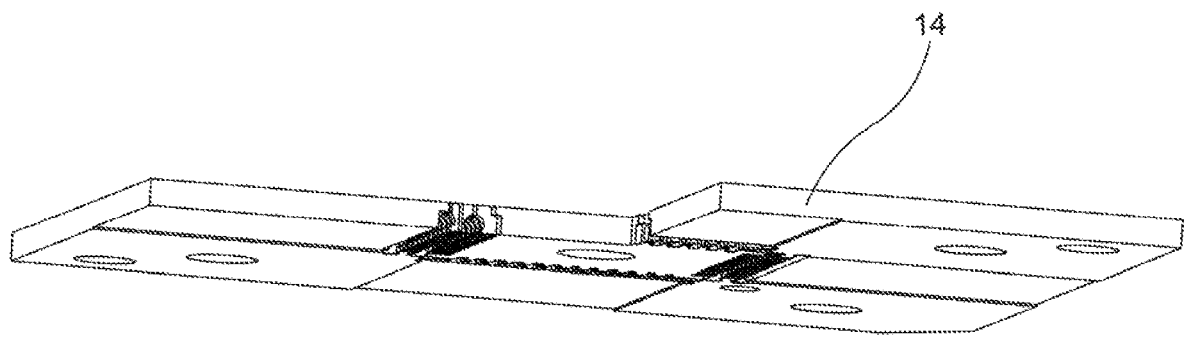
FIG. 21 is a bottom perspective view of a housing with pins removed.

FIG. 21 is a bottom perspective view of a housing with pins removed. This view has vertical beams added to the housing webbing between pins. These beams could also be horizontal or another angle.

Figure 22:
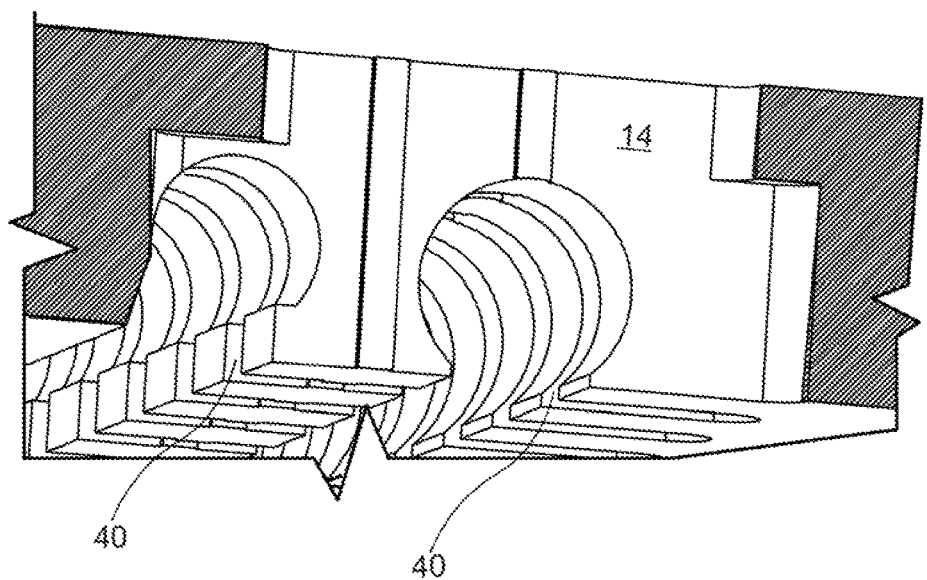
FIG. 22 is a close up view of a portion of FIG. 21.

FIG. 22 is a close up view with slots 40.

Figure 23:
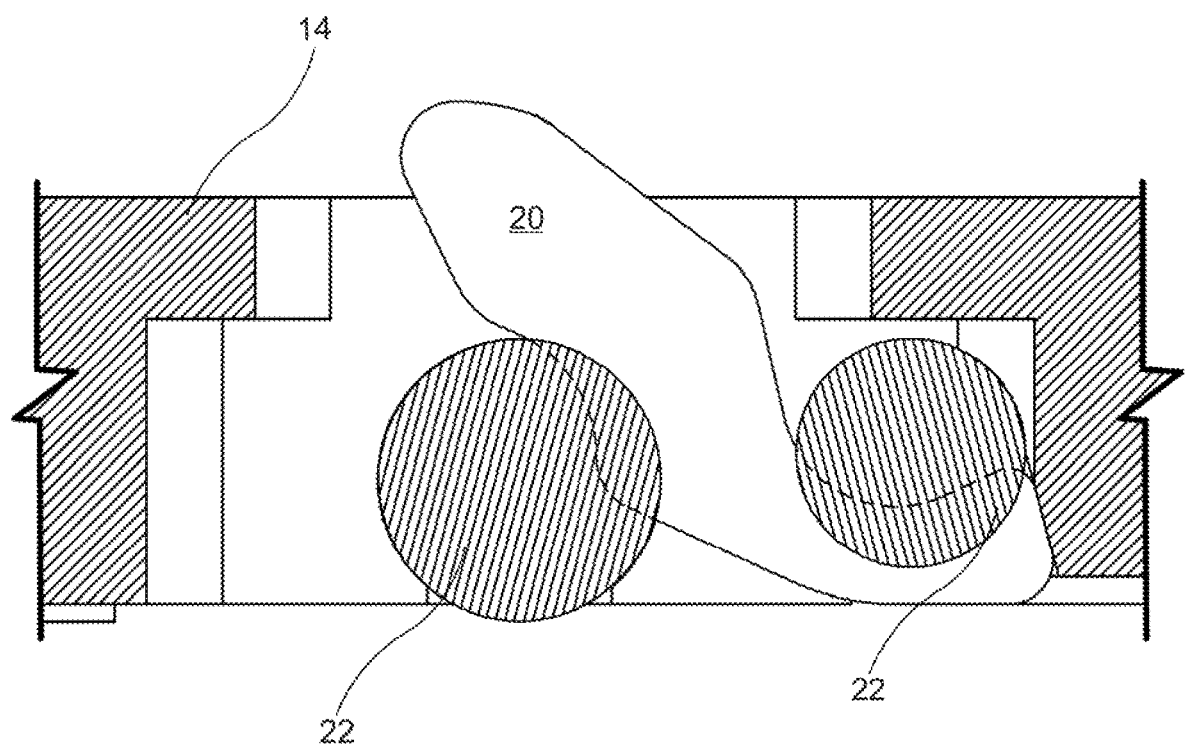
FIG. 23 is a side view sectional of a pin in a housing.

FIG. 23 is a side view sectional of a pin in a housing with elastomers.

Figure 24:
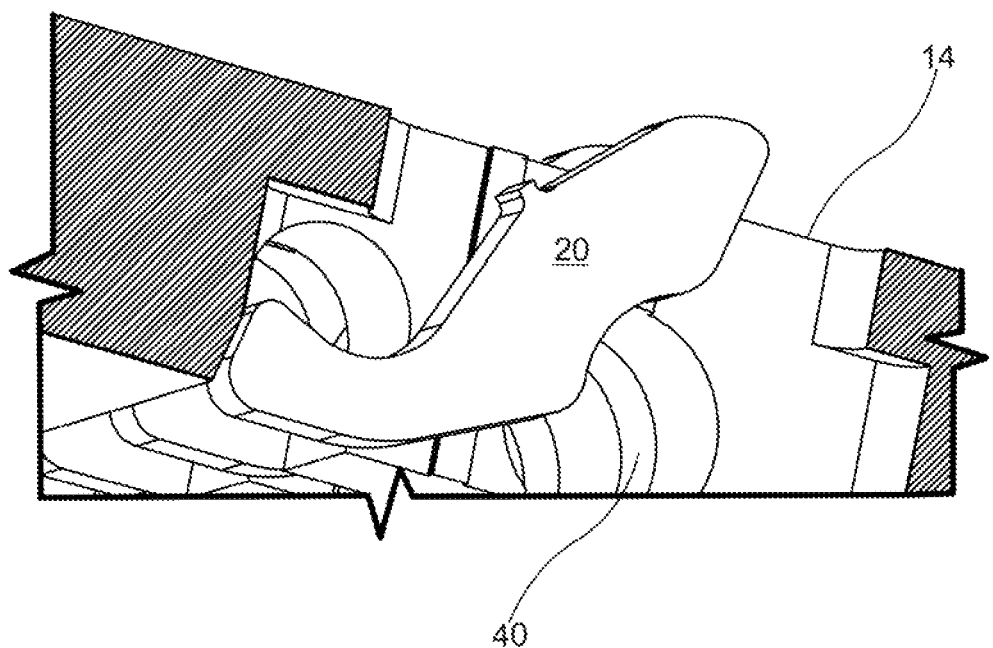
FIG. 24 is a perspective view of FIG. 22.

FIG. 24 is a perspective view of the subject of FIG. 23. Beams are shown as part of the housing to give an air gap between pins.

Figure 25:
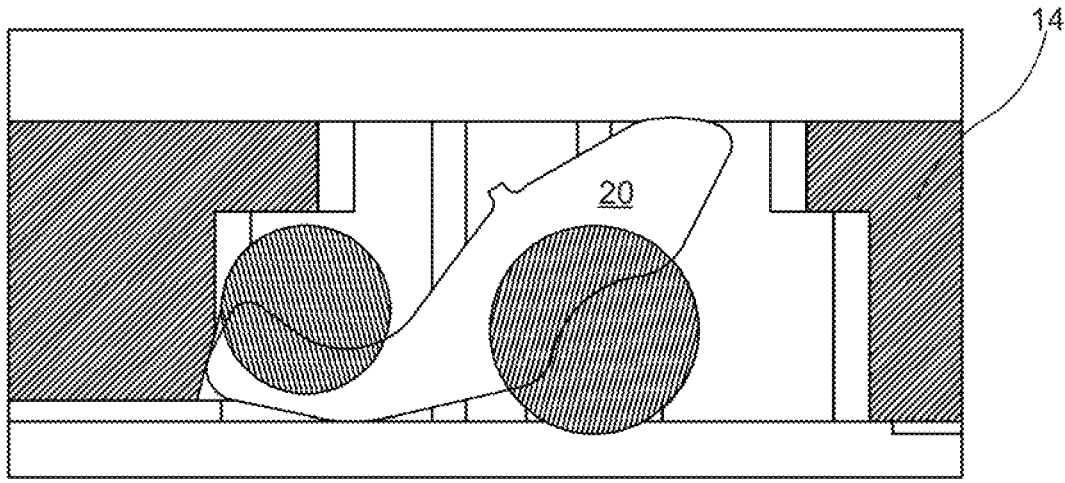
FIG. 25 is a side section view of FIG. 23 with the pin deflected by a DUT.
Figure 26:
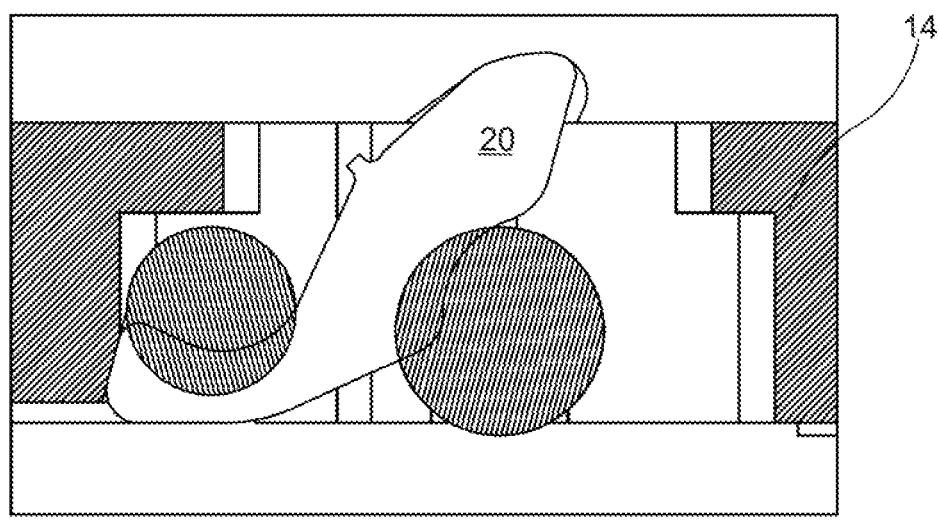
FIG. 26 is a view like FIG. 25 before pin deflection.

FIG. 25 is a side section view of a pin in the housing with the pin deflected downwardly by a DUT. FIG. 26 is a view like FIG. 25 before pin deflection.

Figure 27:
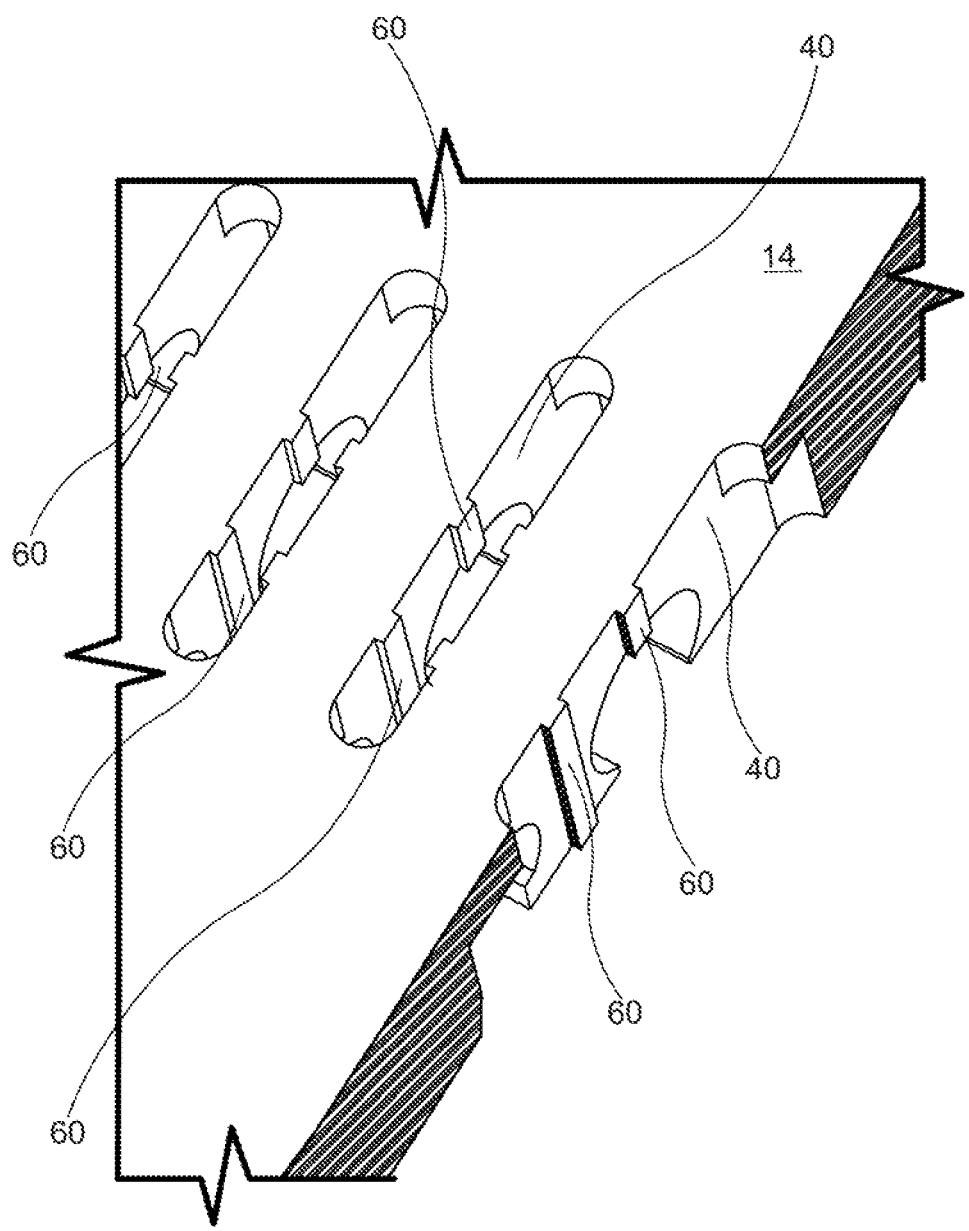
FIG. 27 is a sectional perspective view of a housing having lands/projections into the pin slot.

FIG. 27 is a sectional perspective view of a housing with an alternate embodiment. Instead (or in addition) to having lands/projections on the pin sidewalls, the housing slots 40 can have projections 60 in the space defined by the slot. The projections can extend fully the length of the slot or can be short segments placed at different locations in the slot. The number of projections can be two on each sidewall, as shown, or 1 on each side, or 3 or 4 or more on each side. The number on each side may be the same or unequal. The location on the respective sidewalls may be symmetrical/ mirror image, as shown or asymmetrical, with the projections not directly opposing but offset from the facing projection. The projections can be vertically oriented as shown, or they can be horizontal or at another angle. The projections do not need to be straight. They can be curved.

Figure 28:
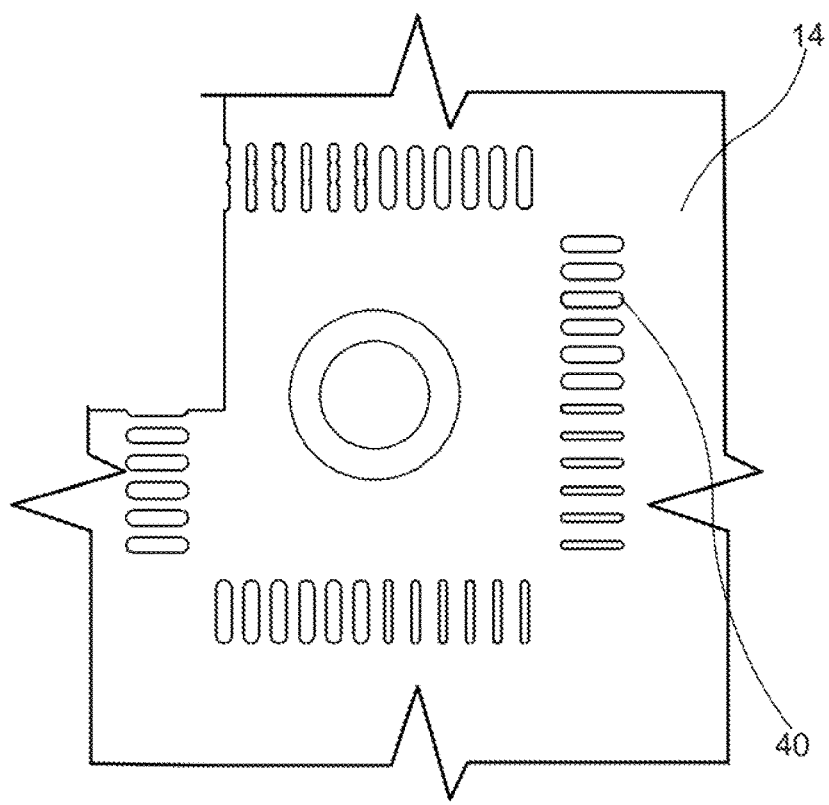
FIG. 28 is a schematic view of a housing with portions broken away.
Figure 29:
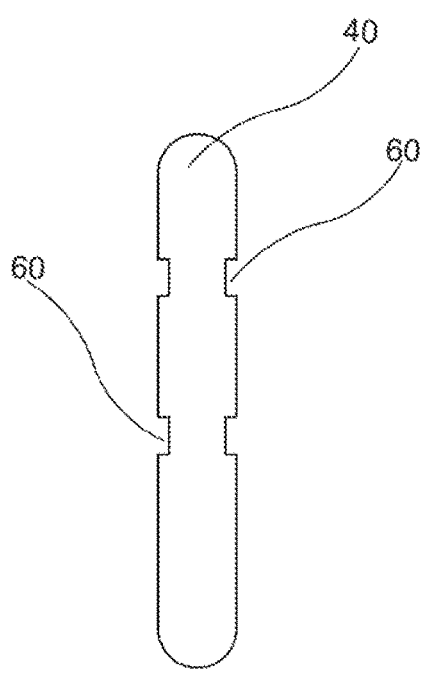
FIG. 29 is a top view of a slot having lands/projections like FIG. 27.
Figure 30:
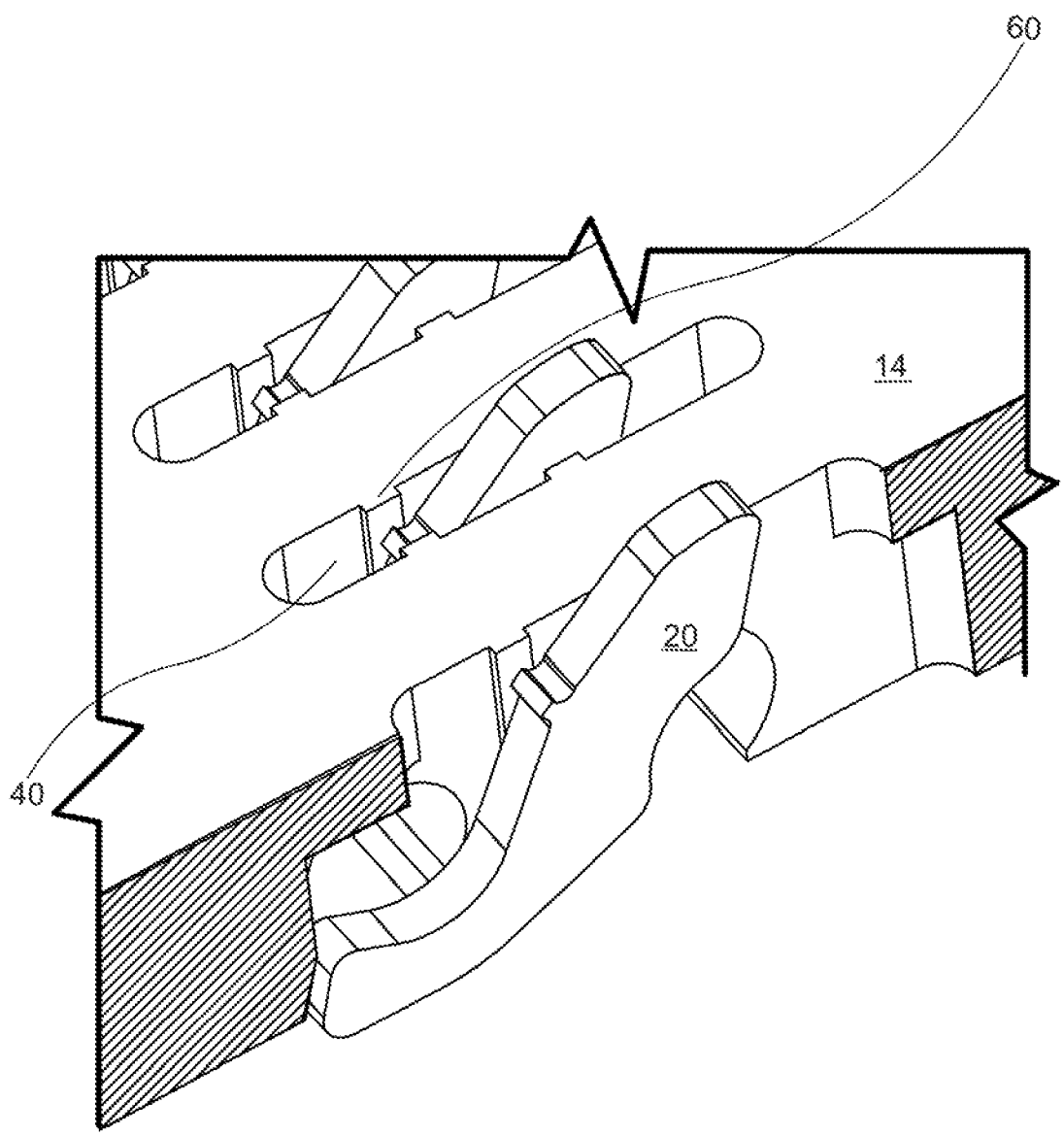
FIG. 30 is a view like FIG. 27 with a pin in place.

FIG. 28 is a schematic view of a housing with portions broken away with FIG. 29 is a top view of a slot having lands/projections described above and FIG. 30 shows a perspective view.

The projections 60 can be flat as shown, or like the projections on the pins, conical, cylindrical or other shapes so long as they provide stand offs from the sidewall and maximize the dielectric air space.

Figure 31:
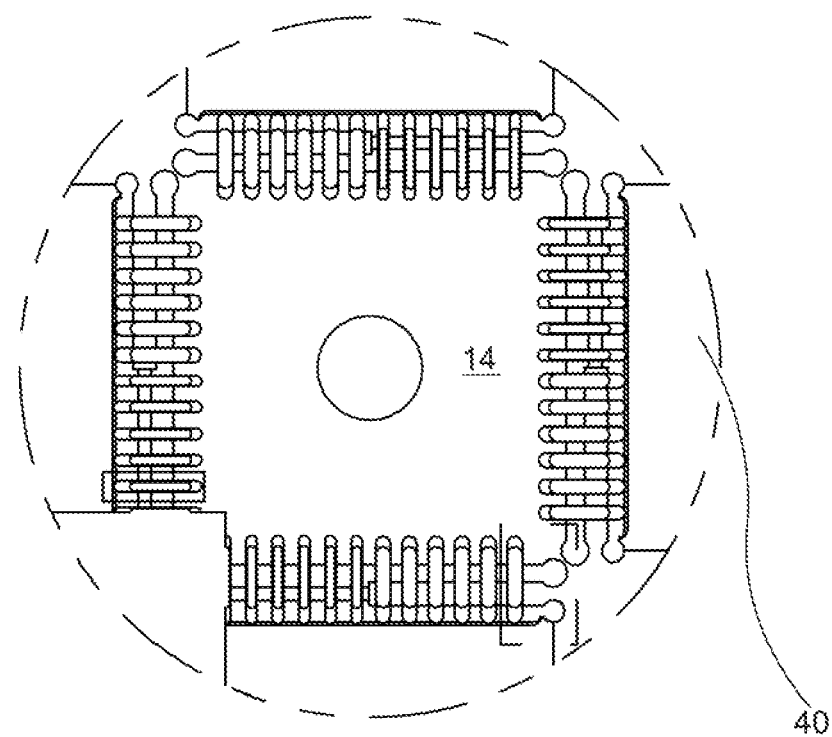
FIG. 31 is a bottom view of a portion of a housing with slots.
Figure 32:
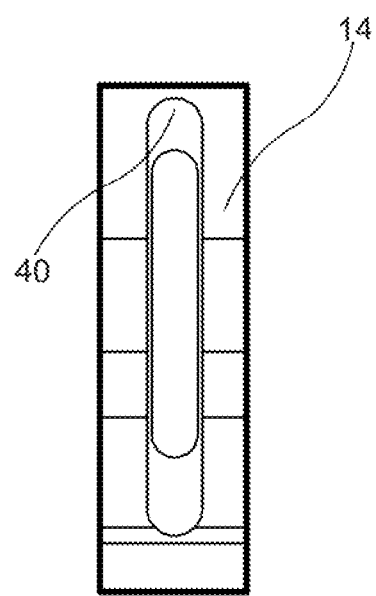
FIG. 32 is a bottom view of one of the slots in FIG. 31. The inner lines central in this figure show that the top part is narrower than the bottom part in accordance with that embodiment which has a wide/narrow pin.
Figure 33:
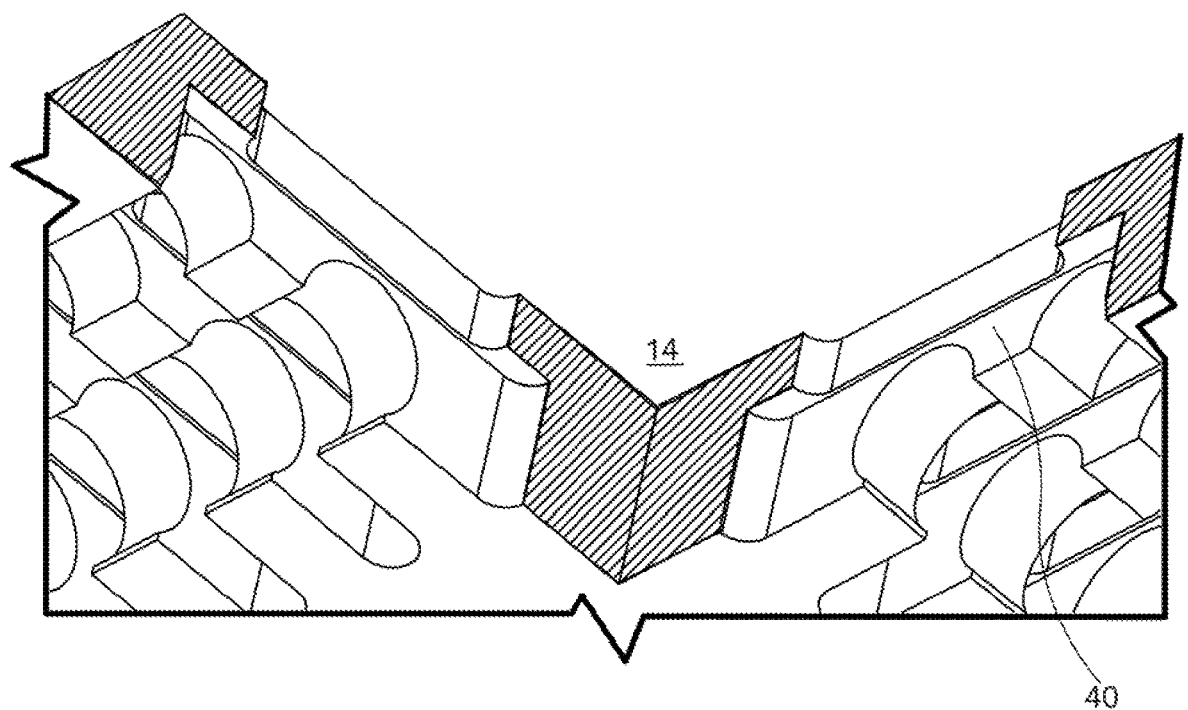
FIG. 33 is a bottom perspective view of a portion of FIG. 31.
Figure 34:
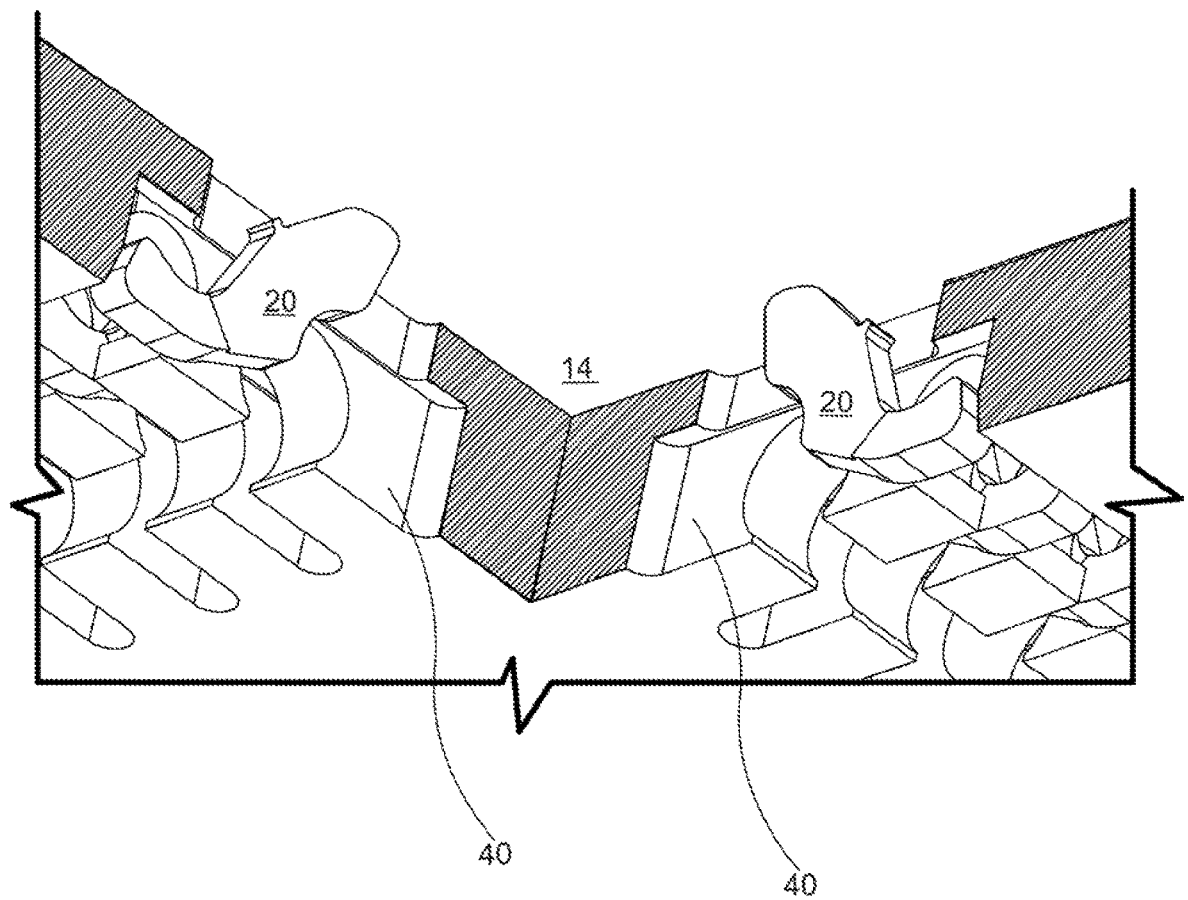
FIG. 34 is view like FIG. 33 with a pin in place.

FIG. 31 is a bottom view of a portion of a housing with slots. FIG. 32 is a top view of one of the slots in FIG. 31 with a pin in place. In this embodiment the slot 40 is narrower at the top than at the bottom which is consistent with the pin which is wider at the bottom and narrower at the top. The sidewall of the slot therefore may have likewise a step of sloped graduation from wide to narrow. The width of the slot is just greater than the thickness/width of the corresponding pin or pin portion. That means that the slot allows for the pin to slide within the slot with little or no friction. FIG. 33 is a bottom perspective view of a portion of FIG. 31 without pins. FIG. 34 is view like FIG. 33 with pins 20 in place.

Figure 35:
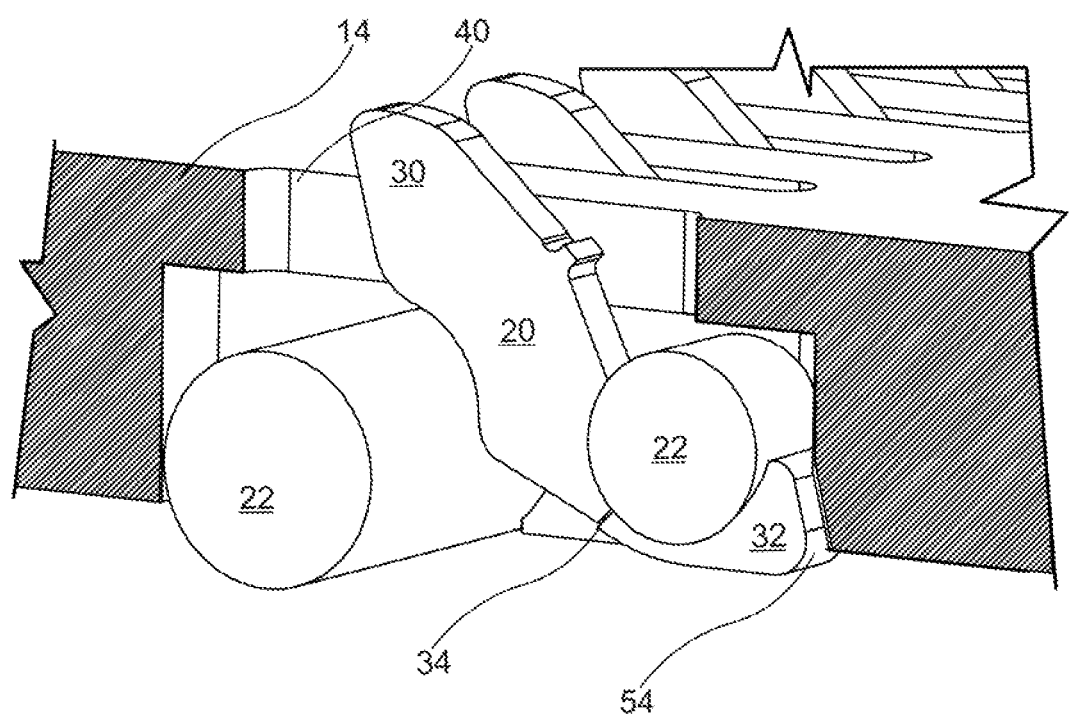
FIG. 35 is a close up perspective view of a pin in a housing with a wide foot/base.

FIG. 35 is a close up perspective view of a pin in a housing with a wide foot/base 32. In this case, the widened portion 32 is substantially limited to the portion of the pin which sits under lower elastomer 42 and extending to tail end 54.

Figure 36:
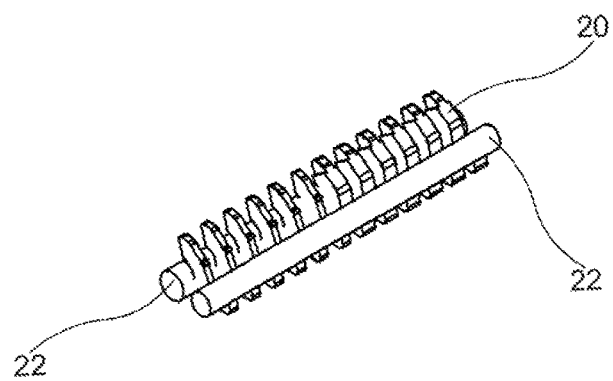
FIG. 36 is a perspective view of a plurality of pins and elastomers.
Figure 37:
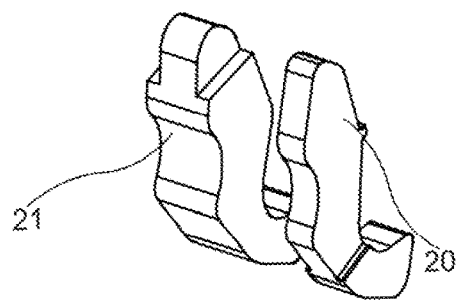
FIG. 37 is a perspective view of a pair of pins of two types.
Figure 38:
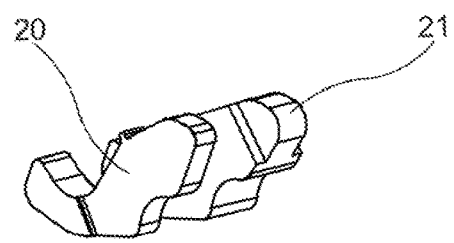
FIG. 38 is another perspective view of the pins in FIG. 37.
Figure 39:
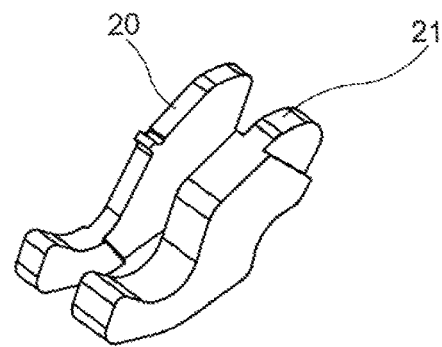
FIG. 39 is another perspective view of the pins in FIG. 37.
Figure 40:
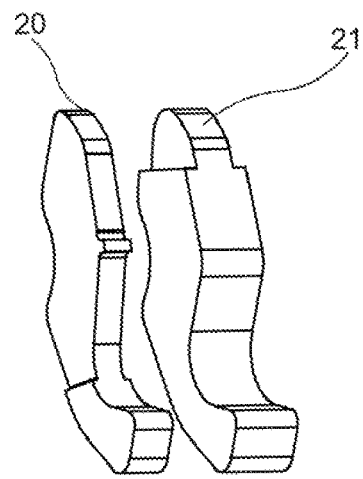
FIG. 40 is another perspective view of the pins in FIG. 37.
Figure 41:
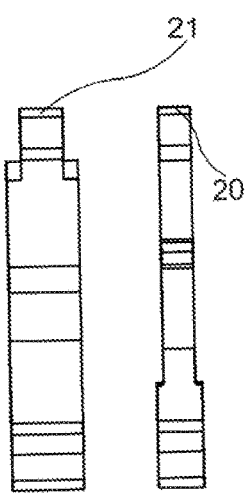
FIG. 41 is a front view of the pins in FIG. 37.
Figure 42:
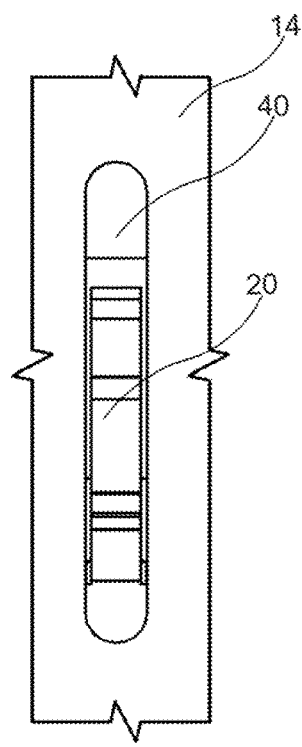
FIG. 42 is a top plan view of a pin in a housing slot with portions broken away. The broken lines denote that the housing would normally be much larger with more pins and slots in it.
Figure 43:
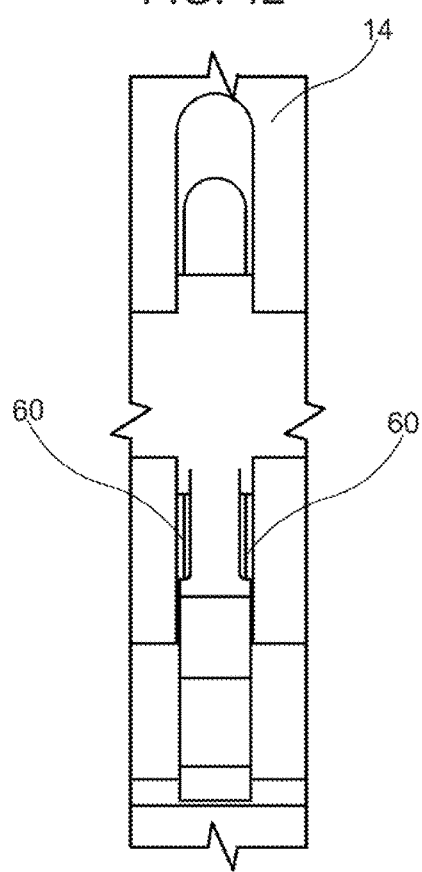
FIG. 43 is a bottom plan view of FIG. 42 with a slot having projections/lands. This shows a wide foot style (i.e. thicker lower portion of the pin) contact in a housing. The foot of the pin is at the bottom of the view. The thinner part of the pin is obscured by the front elastomer.
Figure 44:
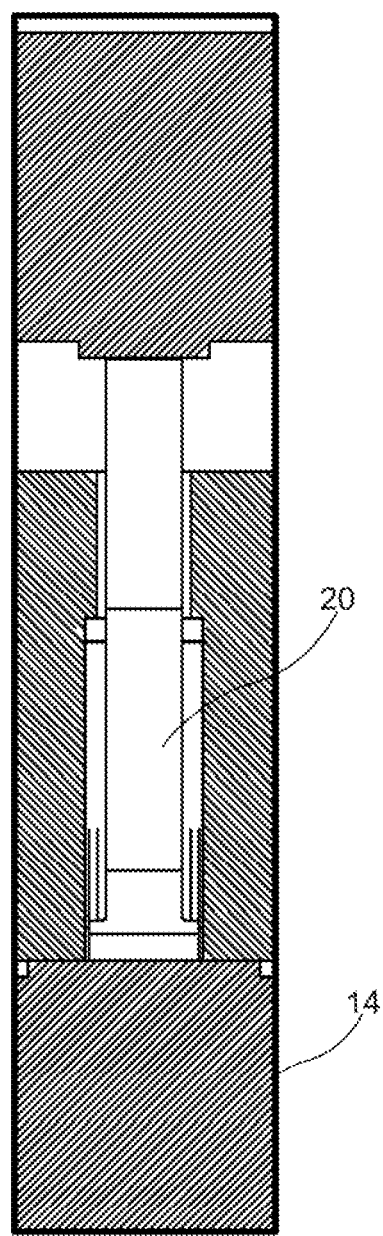
FIG. 44 is view of like FIG. 43. This view is a sectional view with 14 being the load board. The view is from the center of the housing looking toward the outside.
Figure 45:
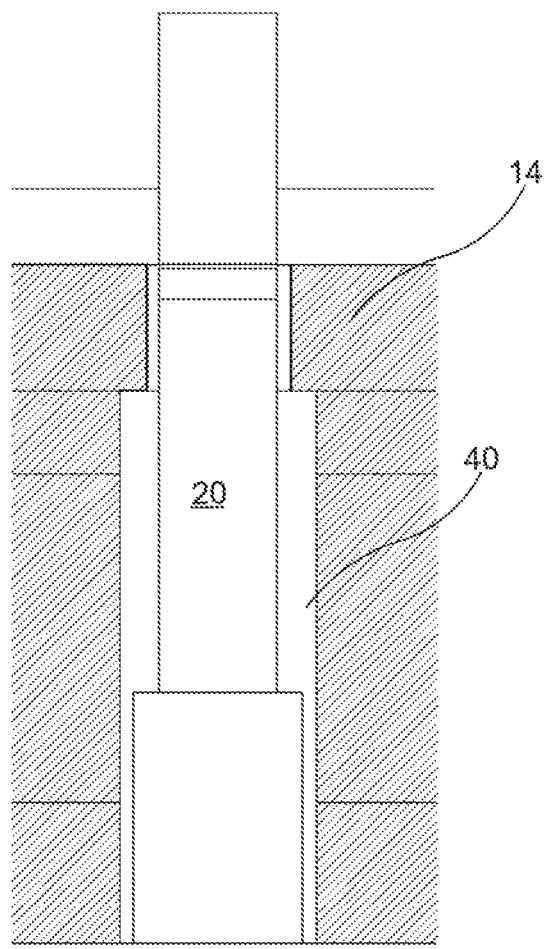
FIG. 45 is a side plan sectional view of FIG. 42 similar to FIG. 44.

FIG. 36 is a perspective view of a plurality of pins 20 and elastomers 22.

FIGS. 37-41 provide a comparison of a full thickness pin 21 with the multi-thickness pin 22. Pin 21 in this case has a narrow tip which is advantageous, but pin 22 is inherently narrow so it does not require a second step.

FIGS. 42-45 show a pin in a housing slot with a pin and projections which could either be on the pin (40) or slot (60).

Figure 46:
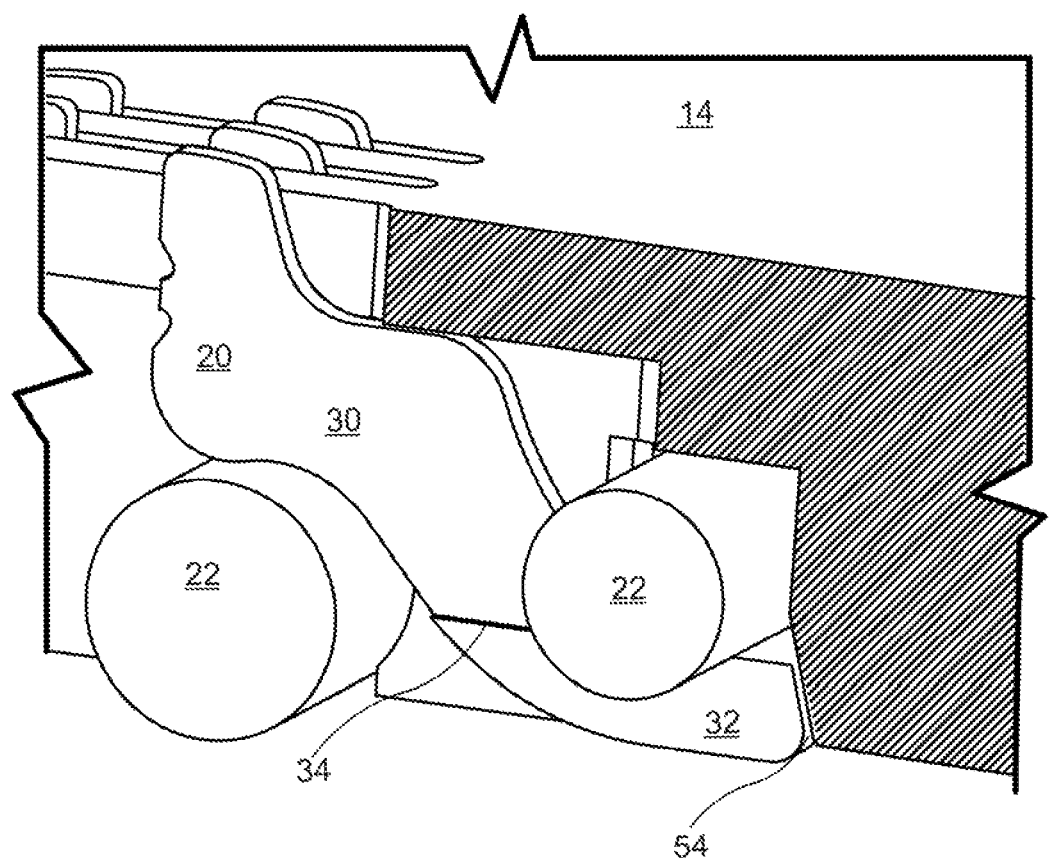
FIG. 46 is a perspective view of a pin and housing with portions broken away similar to FIG. 17 but an alternate embodiment.

FIG. 46 is alternative embodiment similar to FIG. 17. In this embodiment the thickened portion 32 is defined as at a horizontal line 34, below which the remainder of the pin is thicker than the upper portion 30.

Figure 47:
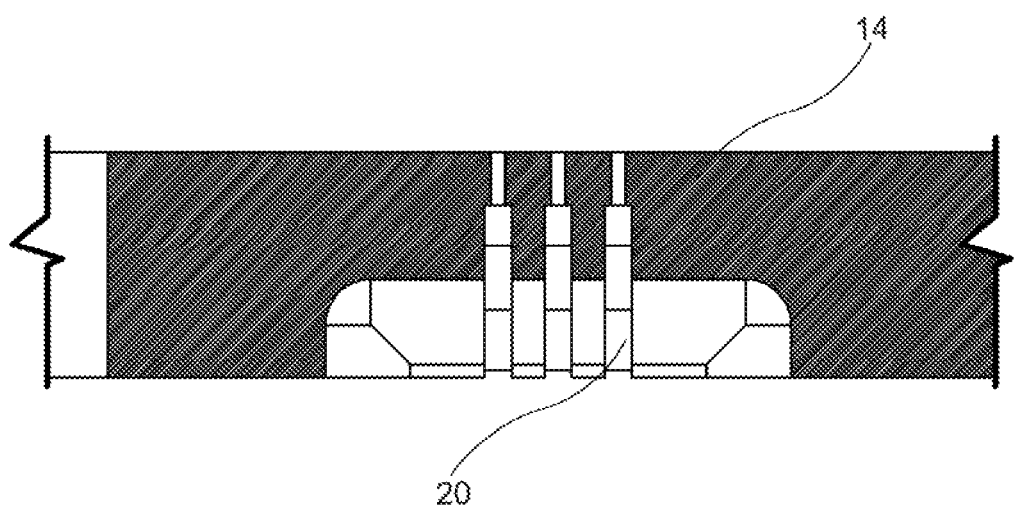
FIG. 47 is a front sectional view of a housing.
Figure 48:
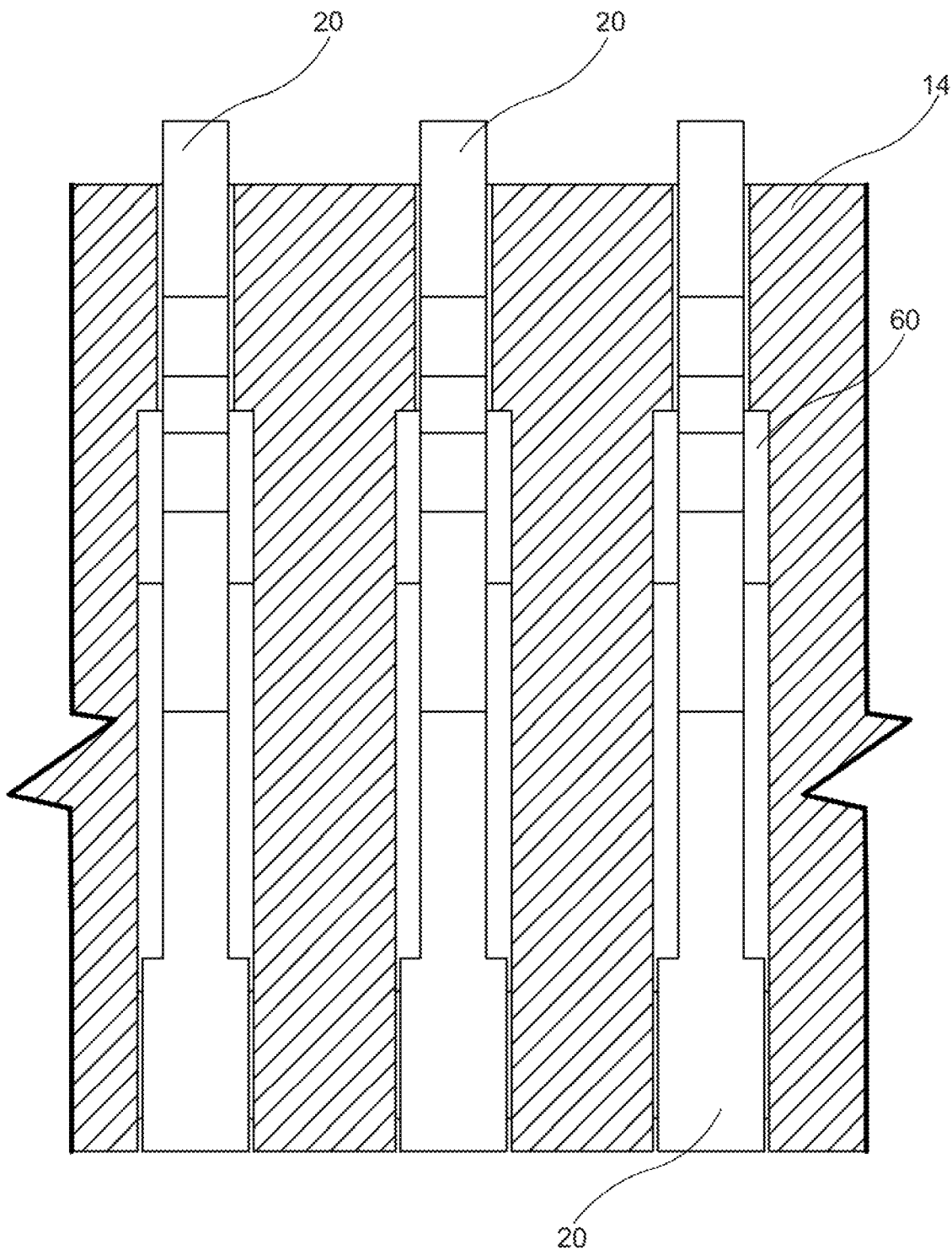
FIG. 48 is a close up view of a portion of FIG. 47.
Figure 49A:
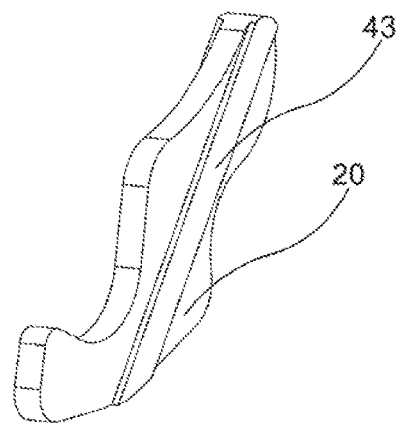
FIG. 49A is a perspective view of an alternate pin embodiment with a diagonal projection/land on one or both sides.
Figure 49B:
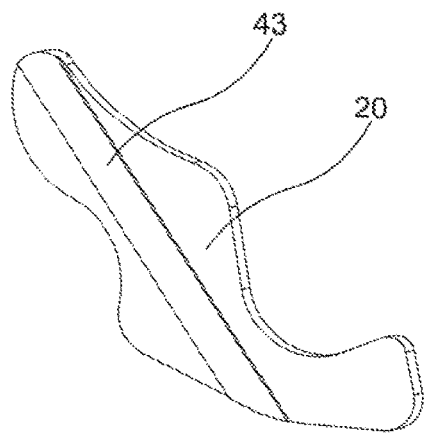
FIG. 49B is a view like FIG. 49A but the other side.
Figure 49C:
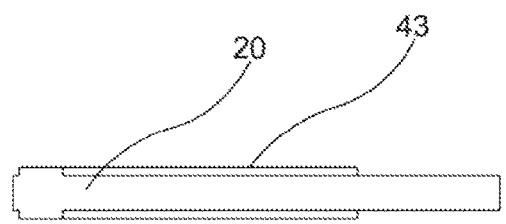
FIG. 49C is a bottom view of FIG. 49A.
Figure 49D:
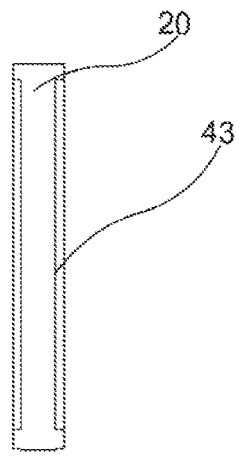
FIG. 49D is a front view of FIG. 49A.
Figure 49E:
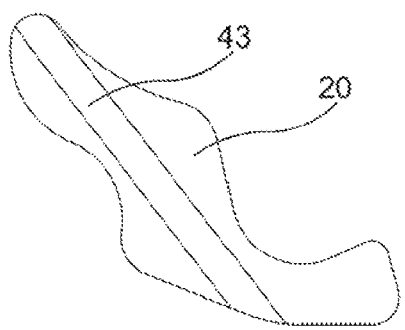
FIG. 49E is a side plan view of FIG. 49A.
Figure 49F:
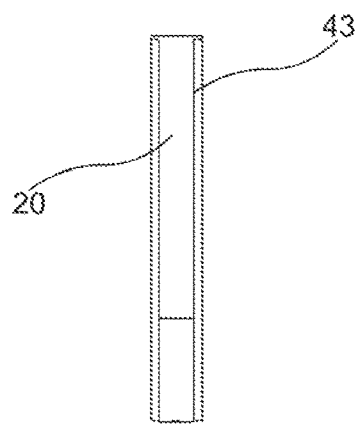
FIG. 49F is a rear view of FIG. 49A.
Figure 49G:
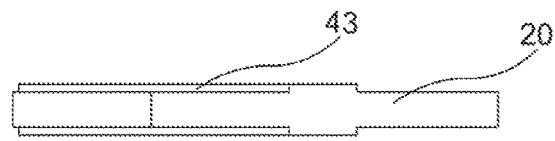
FIG. 49G is a top view of FIG. 49A

FIG. 47 is a front sectional view of a housing and slots with pins. FIG. 48 is a close up view of a portion of FIG. 47 with pins shown.

FIGS. 49A, 49B, 49C, 49D, 49E, 49F and 49G are views of an alternate pin embodiment with a diagonal projection/ land on one or both sides.

In these embodiments, pin 20 had a projection area or land 43 which extends substantially the length of the pin and extends or is applied diagonally across the sidewall or both sidewalls. As in case of protections 42, these projections can be integral to the pin or applied to the pin as an add on element. In the case of an applique, the material may be non-conductive, such as Torlon®. A non-conductor, or conductor coated with an insulating material is desirable because the housing 14 may be metal for certain applications. In this embodiment, land 43 extends adjacent the upper tip (though it does not have to reach that tip) and then diagonally across the pin sidewall to the lower foot of the pin. Again, it does not need to be coexistent with the foot, but it would be desirable because it will spread forces over a greater area, minimizing load board wear. The land may be on both or just one sidewall of the pin.

Figure 50:
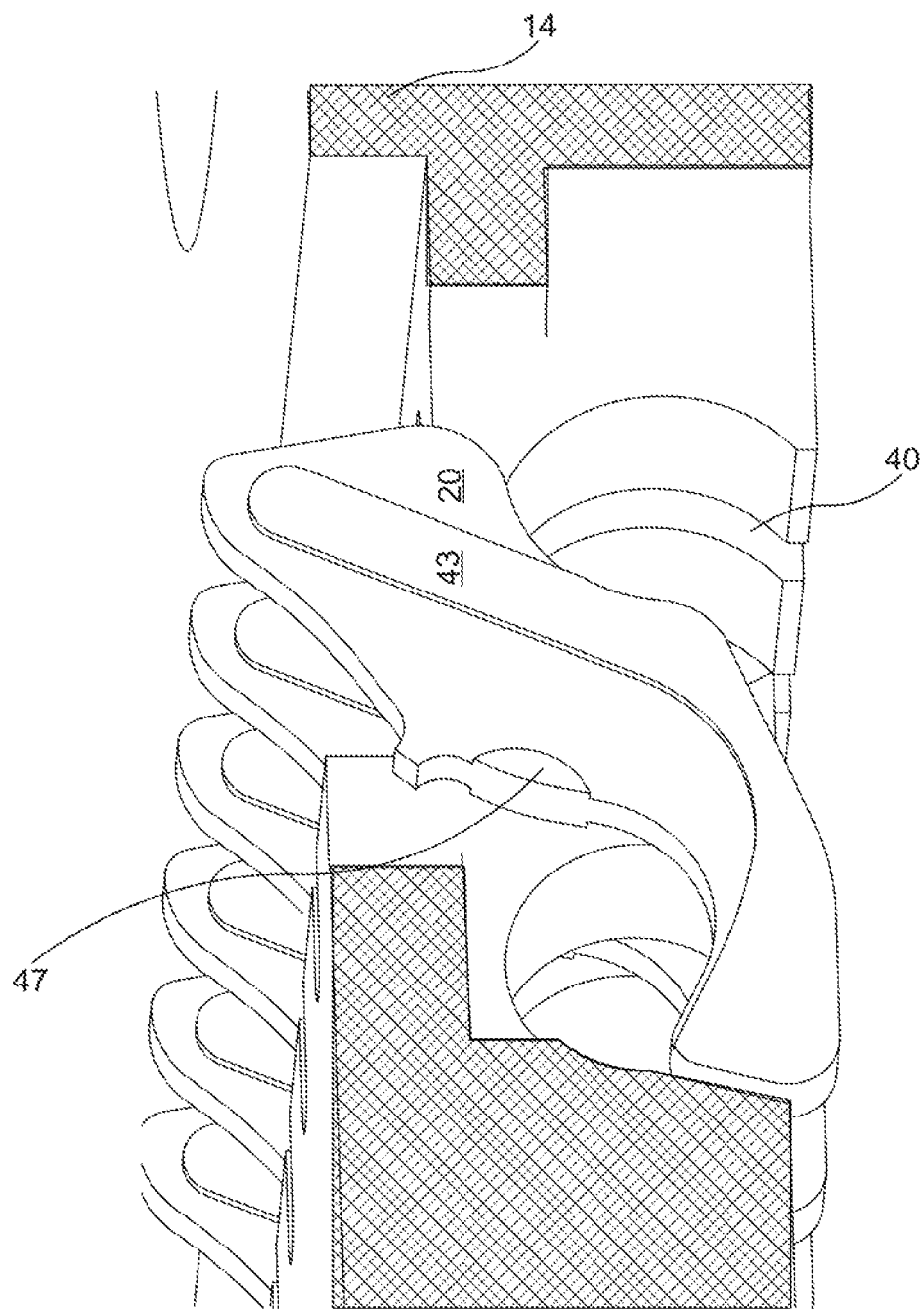
FIG. 50 is a side perspective view with portions broken away of an alternative embodiment of a pin with a shaped projection/land.
Figure 51:
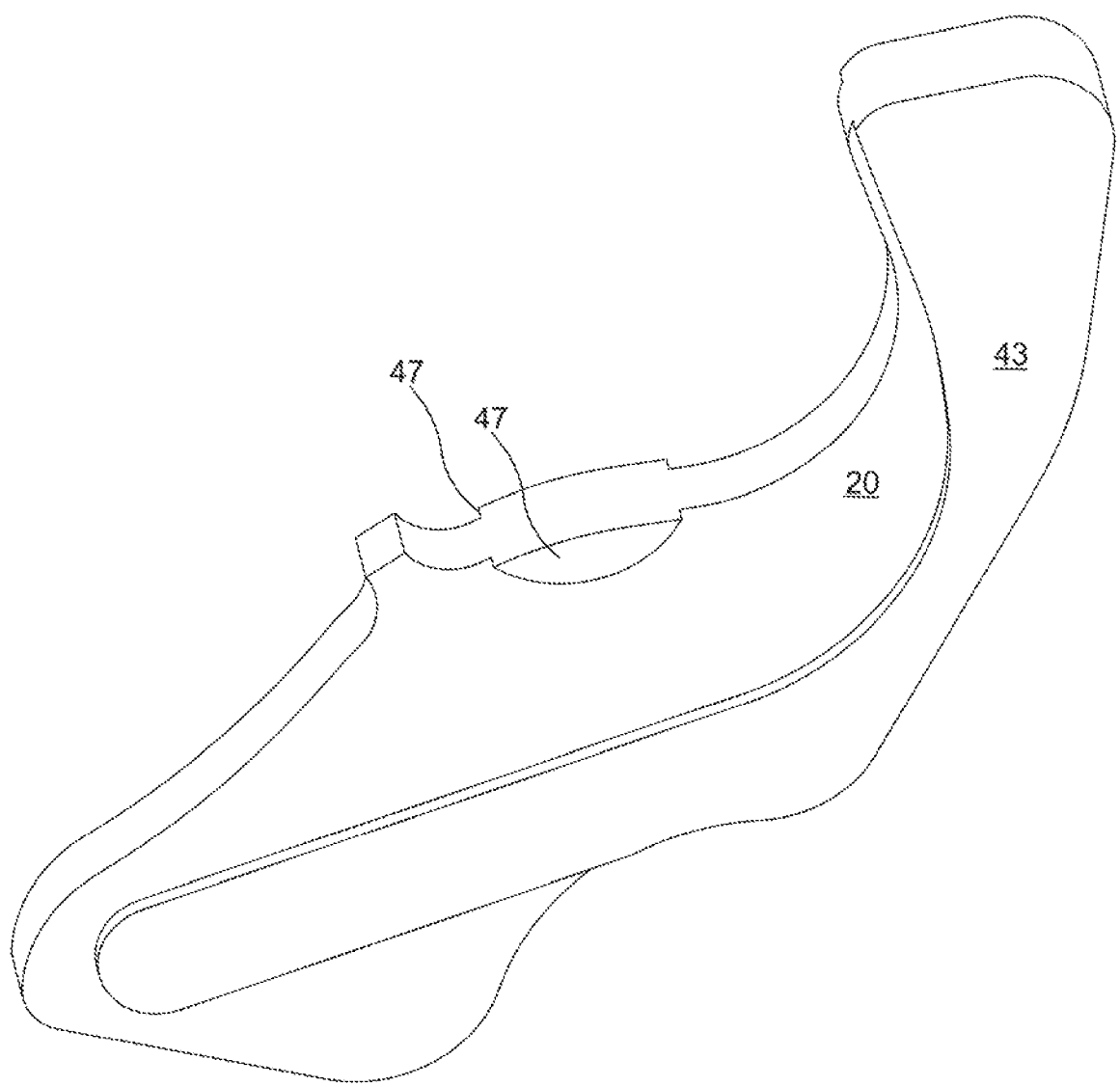
FIG. 51 is a side perspective view of the pin in FIG. 50.
Figure 52:
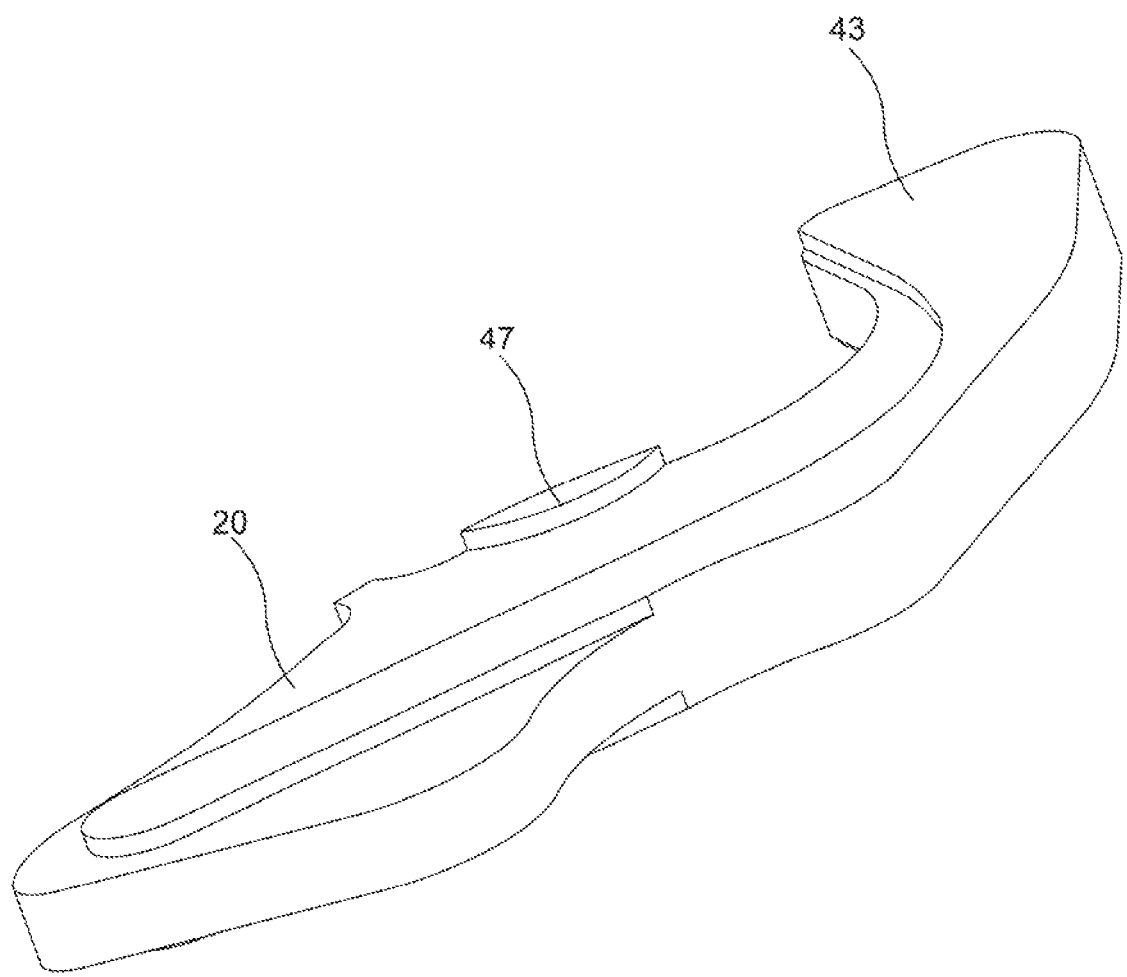
FIG. 52 is a bottom perspective view of the pin in FIG. 50.
Figure 53:
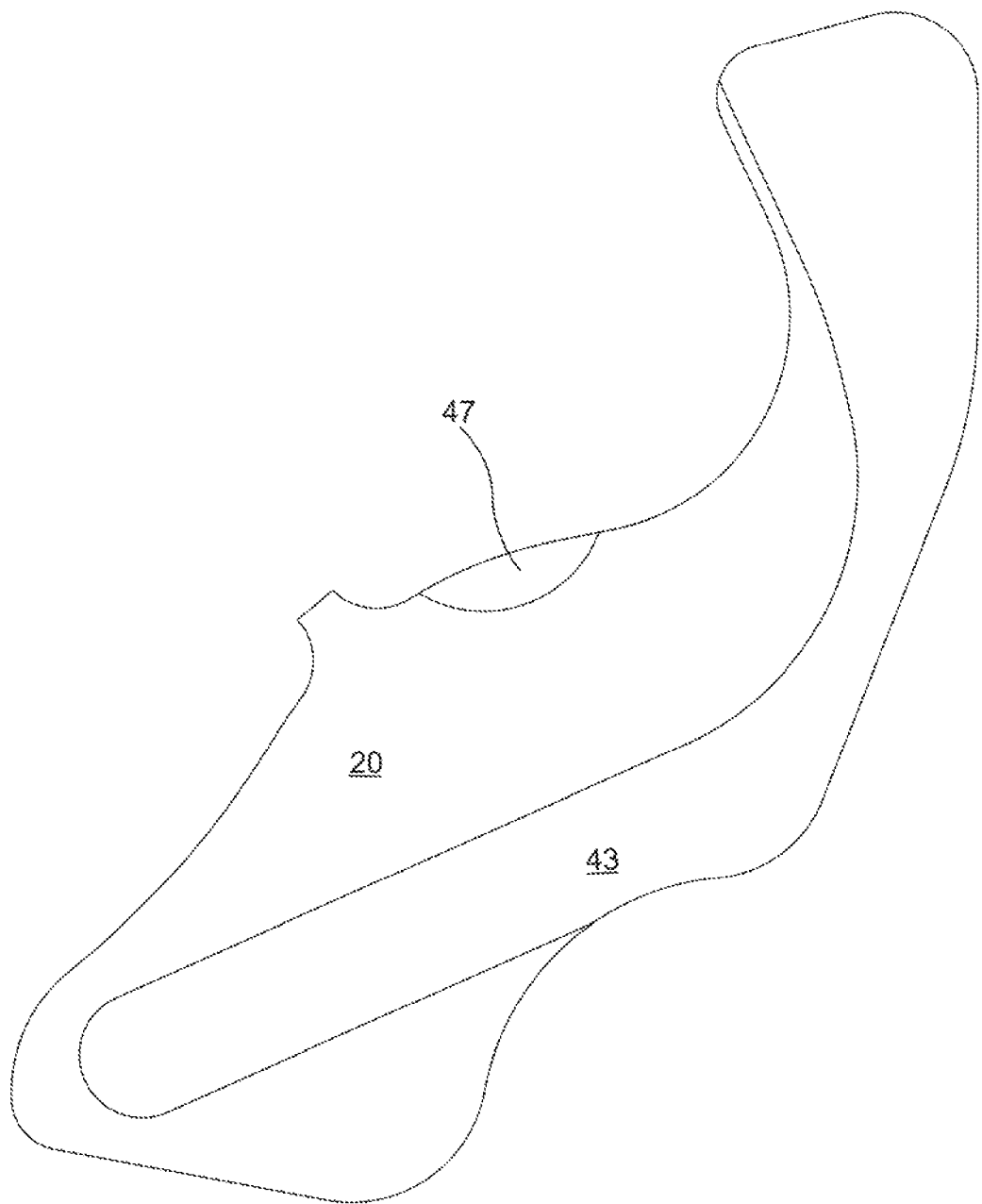
FIG. 53 is a side plan view of the pin in FIG. 50.
Figure 54:
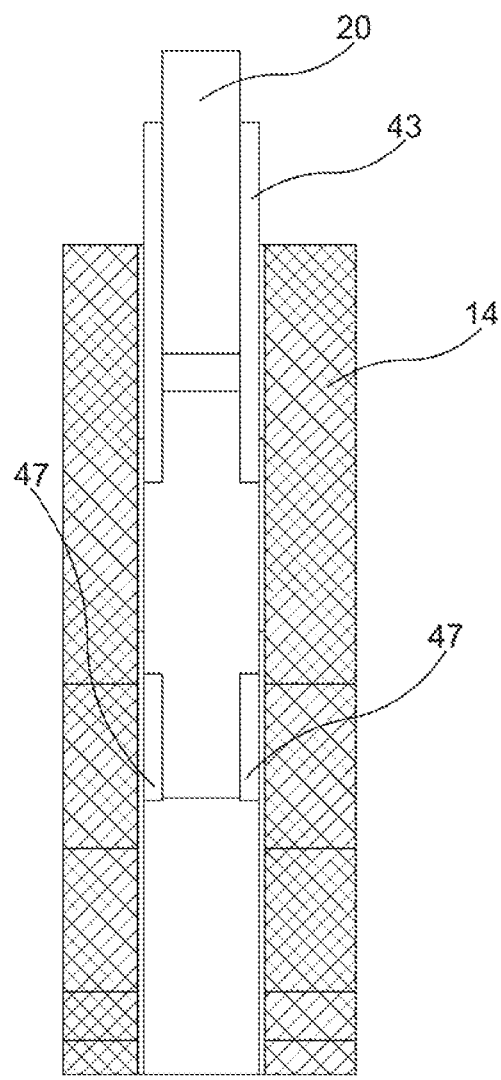
FIG. 54 is a front sectional view of a portion of FIG. 50.

FIGS. 50, 51 and 52 are perspective views of an alternative embodiment which combine features from previously mentioned embodiments. In this embodiment, the land 43 extends from adjacent the upper to, follows a downward path, such as serpentine, s-shaped, toward the foot but becomes part of the pin which has an arcuate recess for the elastomer (not shown) and then becomes part of the lower portion and foot of the pin. In this embodiment, the tail/foot portion of the pin (in contact with the load board) is interposed between the elastomer and the load board. The elastomer applies a downward pressure on the tail. The projection 43 provides a wider pin foot for the load board contact, but much of the rest of the pin has no projection. This provides more space for an air dielectric. This structure therefore does not interfere with the geometric of the pin tip which engaged the DUT but provides boarder engagement with the elastomer, thus reducing the risk of shear and then broadens the foot portion of the pin, likewise reducing pressure and wear on the load board. The land may be on one or both sidewalls of the pin. Also optionally included on this pin is an arcuate land 47 which is located on the edge opposite of land 43. This land 47 is intended as a stabilizer for the pin since it provides a second point of guidance between the inner walls of the slot and therefore improves the pin alignment with the slot. This second land 47 is flush with the peripheral edge of the pin and preferably has an arcuate rear edge and preferably projects as much as land 43 from the pin surface. FIG. 54 is a front sectional view of a portion of FIG. 50.

FIGS. 55A, 55B, 55C and 55D show the pin of FIG. 50 in a housing environment.

Figure 55A:
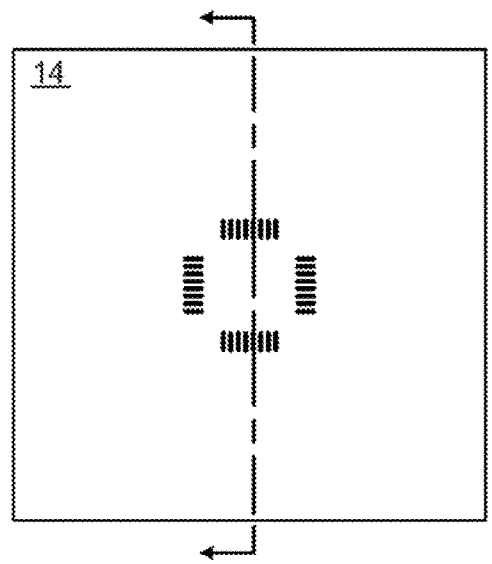
FIG. 55A is a top plan view of a housing with pins.
Figure 55B:
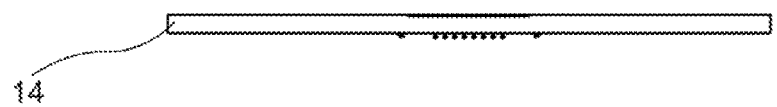
FIG. 55B is a side plan view of a housing with pins.
Figure 55C:
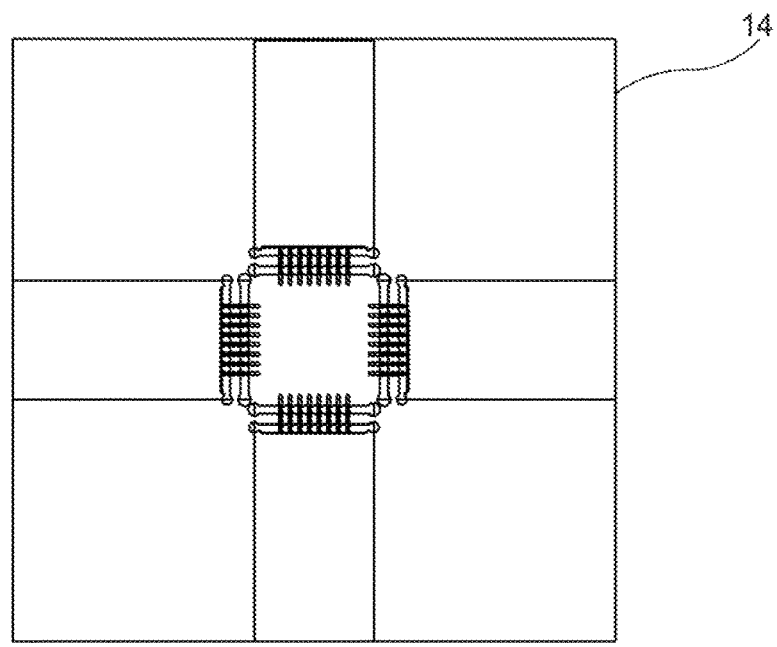
FIG. 55C is a bottom plan view of a housing with pins.
Figure 55D:
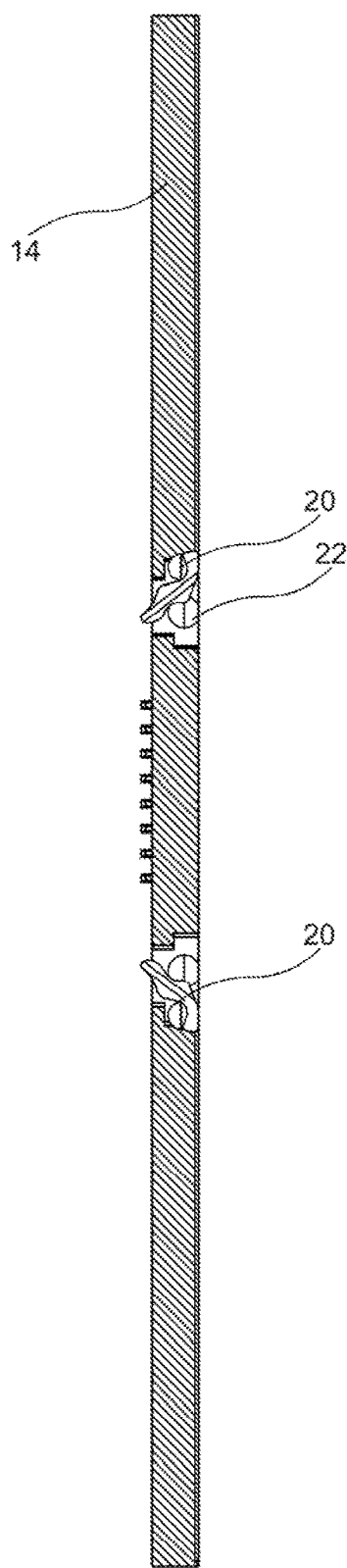
FIG. 55D is a side sectional view of a housing with pins shown.
Figure 56:
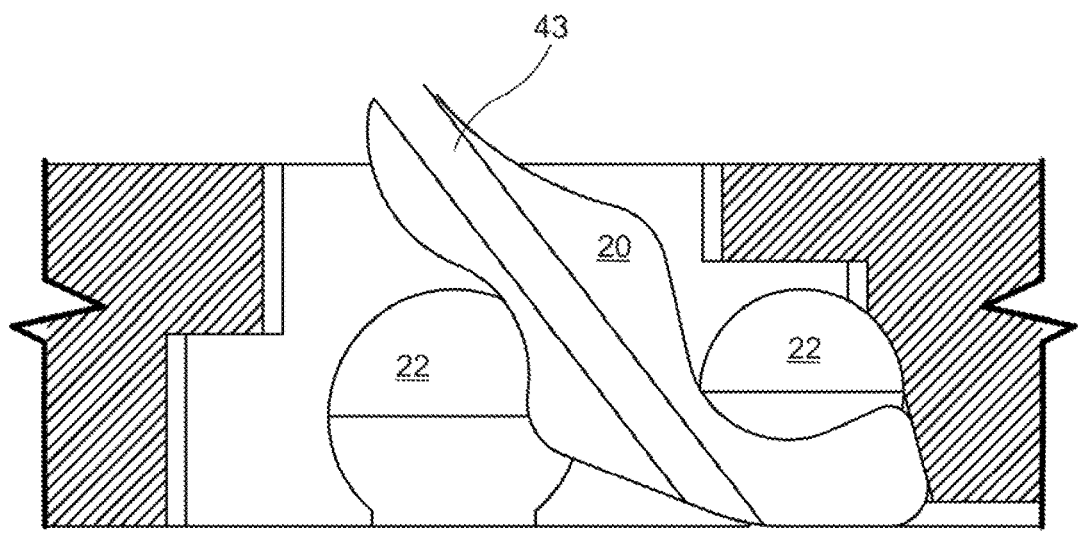
FIG. 56 is a side sectional view of a pin from FIG. 55D in an uncompressed state.
Figure 57:
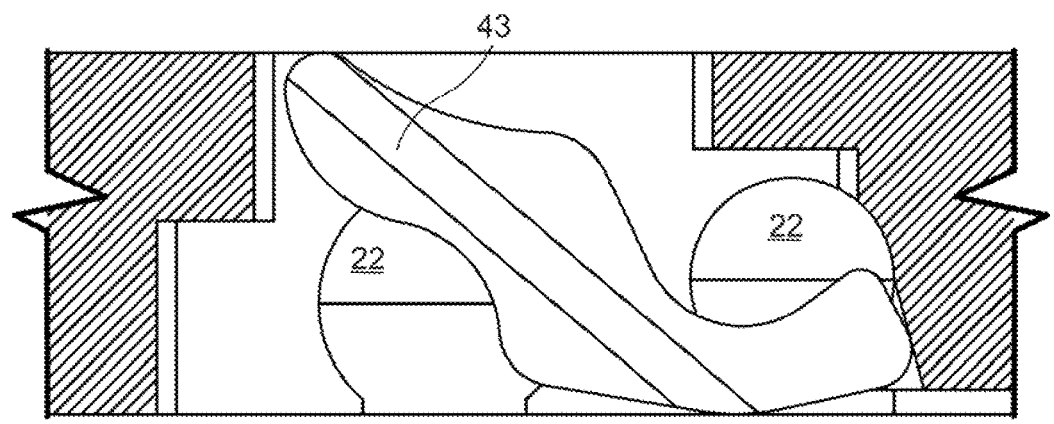
FIG. 57 is a side sectional view of a pin from FIG. 55D in a deflected state.
Figure 58:
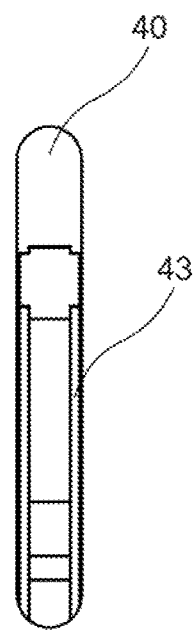
FIG. 58 is a top plan view of a slot from FIG. 56.
Figure 59:
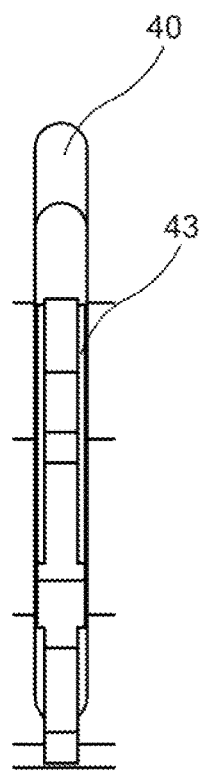
FIG. 59 is a bottom plan view of a slot from FIG. 56.

FIG. 56 is a side sectional view of a pin from FIG. 55D in an uncompressed state, before insertion of a DUT. FIG. 57 is a side sectional view of a pin from FIG. 55D in a deflected state after DUT insertion.

Figure 60:
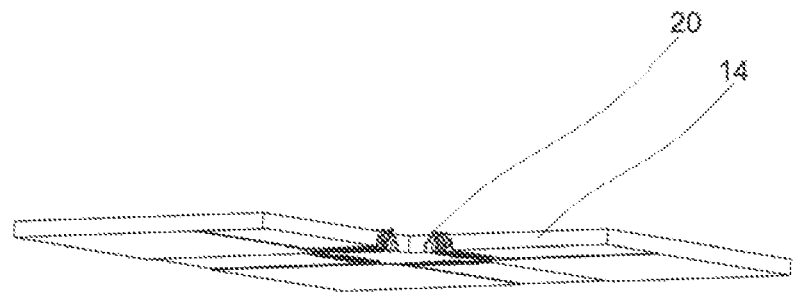
FIG. 60 is a bottom perspective view of a housing with pins and portions broken away.
Figure 61:
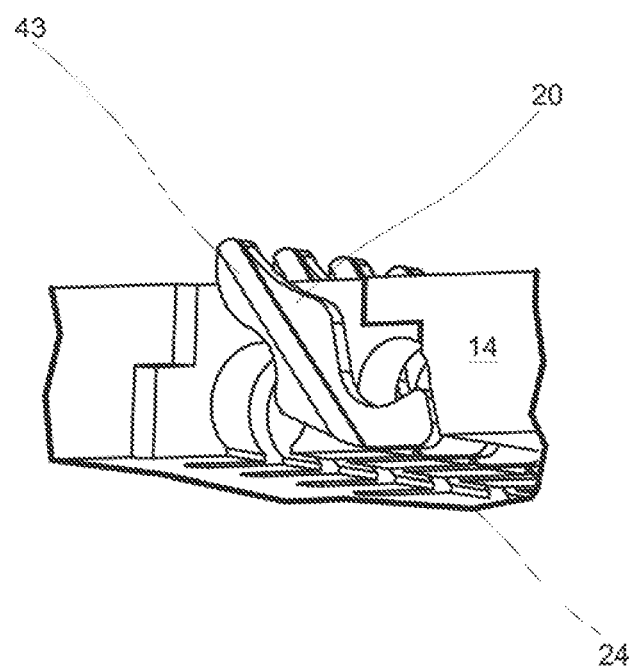
FIG. 61 is a close up perspective view of a pin in a housing from FIG. 60 in an uncompressed state.

FIG. 60 is a bottom perspective view of a housing with pins and portions broken away with a close up view in FIG. 61, with the pin 20 in an uncompressed state.

Figure 62:
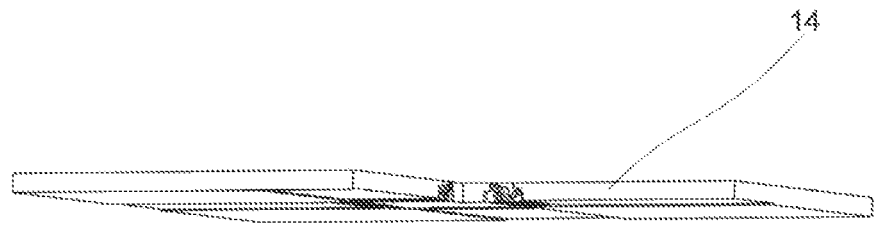
FIG. 62 is a bottom perspective view of a housing with pins and portions broken away.
Figure 63:
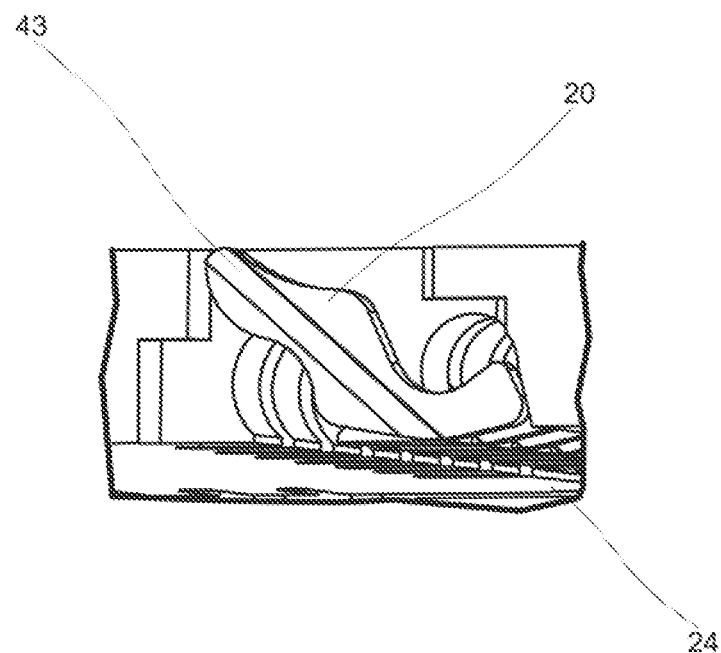
FIG. 63 is a close up perspective view of a pin from FIG. 60 in a deflected state.

FIGS. 62-63 are bottom perspective views of a housing with pins and portions broken away in a deflected state.

Figure 64:
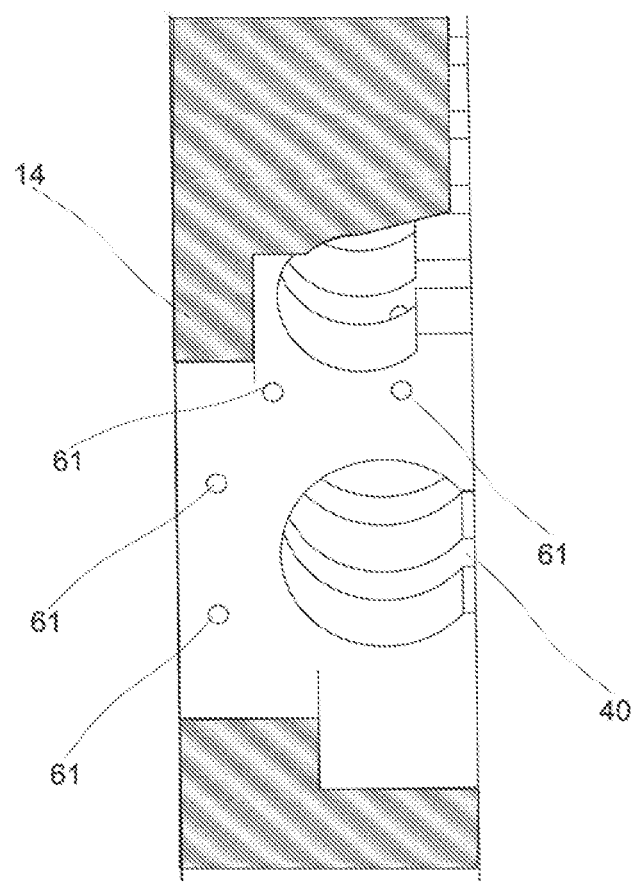
FIG. 64 is a side perspective view of a housing having a plurality of projections.
Figure 65:
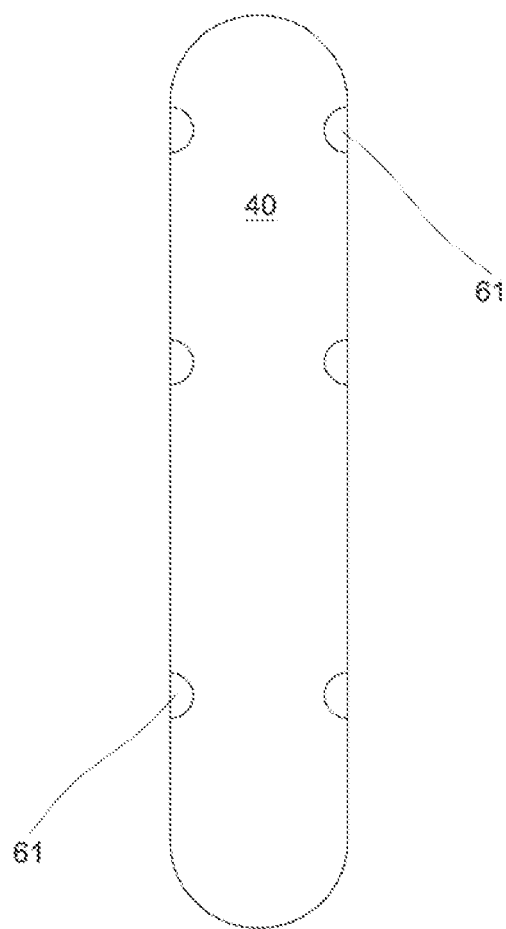
FIG. 65 is a top plan view of the slot/housing in FIG. 64.

FIG. 64 is a side perspective view of a housing having a plurality of projections 61 which provide the same function as projections 60 in FIG. 27 of keeping the pin spaced from the housing wall by providing maximum air dielectric spacing. The projections 61 can be symmetrically or asymmetrically placed on the opposing sidewalls of the slot 40. The projections as shown are cylindrical but may be conical, truncated, or other shapes so long as they provide the required standoff. Conical or domed/hemispherical projections are shown in FIG. 65.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. An apparatus for electrically connecting a lead of an integrated circuit (12) device to be tested to a corresponding terminal of a load board (24) at a test site, comprising:
   a. a housing (14) having upper and lower surfaces, a first surface approachable by an integrated circuit device under test (12) to be tested and a second surface proximate the load board;
   b. a slot extending through said housing from the first surface to the second surface, said slot including parallel spaced apart opposing first and second inner walls thereby defining a space between said first and second inner walls;
   c. a contact pin (20) having first and second sidewalls and being slideably receivable in said slot (40), said pin having a first end engagable by the lead and a second end in engagement with the terminal, said pin filling only a portion of said slot thereby leaving a gap between said pin sidewalls and said slot inner walls;
   d. a first projection (61, 60, 47, 42, 43, 34) filling a portion of said gap adjacent said first inner wall and a second projection filling a portion of said gap adjacent said second inner wall; said projections providing longitudinal stability for said pin as it is engaged by the device under test and allowing air to provide a dielectric around said projections in said gap.

2. The apparatus of claim 1 wherein said projections extend from said pin toward said inner wall.

3. The apparatus of claim 1 wherein housing includes tubular elastomeric resilient element and wherein said pin includes an arcuate recess for receiving a portion of said resilient element and wherein said projection extends from said pin sidewalls and encompasses at least a portion of said resilient element.

4. The apparatus of claim 1 wherein said projections are a plurality of lands spaced across the pin sidewall.

5. The apparatus of claim 4 wherein said lands are asymmetrically placed on said first side wall relative to said second sidewall.

6. The apparatus of claim 1 wherein said projections are a plurality of lands spaced across the pin inner wall of said slots.

7. The apparatus of claim 1 wherein said projections extend from one or both of said inner walls of said slot toward said pin.

8. The apparatus of claim 1 wherein said pin includes a top and bottom ends and wherein said projections extend adjacent said top and bottom ends.

9. The apparatus of claim 1 wherein said pin includes a top and bottom ends and wherein said projections extend between said top and bottom ends along a curved path.

10. The apparatus of claim 1 wherein said pin includes a top and bottom ends and wherein said projections extend between said top and bottom ends along a curved path and including a land portion partially surrounding said resilient member.

11. The apparatus of claim 1 wherein said pin includes a top and bottom ends and wherein said projections extend between said top and bottom ends along a diagonal path.

12. The apparatus of claim 1 wherein said housing (14) includes a top surface having said slots (40) and wherein said surface adjacent said slots is recessed (31) thereby exposing a portion of said pins to air.

13. The apparatus of claim 1 wherein said contact pin includes an upper portion of predetermined thickness and a lower portion of thickness greater than said predetermined thickness and wherein said slot had upper and lower spaced apart sidewalls, said upper sidewalls being spaced to just accommodate said upper portion of said pin portion and said lower sidewalls being spaced apart to just accommodate said lower pin portion, so that said pin may slide within said sidewalls.

14. An apparatus for electrically connecting a lead of an integrated circuit (12) device to be tested to a corresponding terminal of a load board (24) at a test site, comprising:
   a. a housing (14) having upper and lower surfaces, a first surface approachable by an integrated circuit device under test (12) to be tested and a second surface proximate the load board;
   b. a slot extending through said housing from the first surface to the second surface, said slot including parallel spaced apart opposing first and second inner walls thereby defining a space between said first and second inner walls;
   c. a contact pin (20) having first and second sidewalls and being slideably receivable in said slot (40), said pin having a first end engagable by the lead and a second end in engagement with the terminal, said pin filling only a portion of said slot thereby leaving a gap between said pin sidewalls and said slot inner walls;
   d. a first projection (61, 60, 47, 43, 42, 34) filling a portion of said gap extending from said first inner wall and a second projection filling a portion of said gap extending from said second inner wall; said projections providing longitudinal stability for said pin as it is engaged by the device under test and allowing air to provide a dielectric around said projections in said gap.

15. The apparatus of claim 14 wherein said projections are lands having planar distal surfaces.

16. The apparatus of claim 14 wherein said projections are conical having planar distal surfaces.

17. The apparatus of claim 14 wherein said projections are spherical.

18. The apparatus of claim 17 wherein housing includes tubular elastomeric resilient element and wherein said pin includes an arcuate recess for receiving a portion of said resilient element and wherein said projection extends from said pin sidewalls and encompasses at least a portion of said resilient element; and further including a stabilizer projection.

19. The apparatus of claim 14 wherein said projections are cylindrical and having planar distal surfaces.

20. An apparatus for electrically connecting a lead of an integrated circuit (12) device to be tested to a corresponding terminal of a load board (24) at a test site, comprising:
   a. a housing (14) having upper and lower surfaces, a first surface approachable by an integrated circuit device under test (12) to be tested and a second surface proximate the load board;
   b. a slot extending through said housing from the first surface to the second surface, said slot including parallel spaced apart opposing first and second inner walls thereby defining a space between said first and second inner walls;
   c. a contact pin (20) having first and second sidewalls and being slideably receivable in said slot (40), said pin having a first end engagable by the lead and a second end in engagement with the terminal, said pin filling only a portion of said slot thereby leaving a gap between said pin sidewalls and said slot inner walls;
   d. a first projection (61, 60, 47, 43, 42, 34) filling a portion of said gap extending from said first and second pin sidewalls and filling a portion of said gap extending from said second inner wall; said projections providing longitudinal stability for said pin as it is engaged by the device under test and allowing air to provide a dielectric around said projections in said gap.

21. A method of making an integrated circuit test contactor for testing a device under test, the housing having upper and lower surfaces, a first surface approachable by an integrated circuit device under test (12) to be tested and a second surface proximate the load board; a slot extending through said housing from the first surface to the second surface, said slot including parallel spaced apart opposing first and second inner walls thereby defining a space between said first and second inner walls; a contact pin having first and second sidewalls and being slideably receivable in said slot, said pin having a first end engagable by the lead and a second end in engagement with the terminal, said pin filling only a portion of said slot thereby leaving a gap between said pin sidewalls and said slot inner walls; comprising:
   forming a first projection filling a portion of said gap adjacent said first inner wall and a second projection filling a portion of said gap adjacent said second inner wall; allowing air to fill spaces around said projections to provide a dielectric around said projections in said gap.

22. The method of claim 21 wherein said step of forming first and second projections includes forming a projection extending from one or both of said inner walls.

23. The method of claim 21 wherein said step of forming first and second projections includes forming a projection extending from one or both of said sidewalls of said pin.

* * * * *